(12) United States Patent
Berk et al.

(10) Patent No.: US 12,334,711 B2
(45) Date of Patent: Jun. 17, 2025

(54) FABRICATING SEMICONDUCTOR DEVICES, SUCH AS VCSELs, WITH AN OXIDE CONFINEMENT LAYER

(71) Applicant: Mellanox Technologies, Ltd., Yokneam (IL)

(72) Inventors: Yuri Berk, Kiryat Tivon (IL); Vladimir Iakovlev, Ecublens (IL); Anders Larsson, Hovas (SE); Itshak Kalifa, Bat—Yam (IL); Matan Galanty, Korazim (IL); Isabelle Cestier, Haifa (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 411 days.

(21) Appl. No.: 17/303,050

(22) Filed: May 19, 2021

(65) Prior Publication Data
US 2022/0376476 A1 Nov. 24, 2022

(51) Int. Cl.
*H01S 5/183* (2006.01)
*H01S 5/34* (2006.01)
(Continued)

(52) U.S. Cl.
CPC ........ *H01S 5/18311* (2013.01); *H01S 5/3416* (2013.01); *H01S 5/34306* (2013.01); *H01S 5/423* (2013.01); *H01S 5/04257* (2019.08)

(58) Field of Classification Search
CPC .................................................. H01S 5/18311
See application file for complete search history.

(56) References Cited

U.S. PATENT DOCUMENTS 5,206,872 A * 4/1993 Jewell ................. H01S 5/18341
372/92
5,896,408 A 4/1999 Corzine et al.
(Continued)

FOREIGN PATENT DOCUMENTS

CN 1889314 A 1/2007
CN 112382927 A 2/2021

OTHER PUBLICATIONS

Definition of "on" (Year: 2024).*
(Continued)

*Primary Examiner* — Xinning(Tom) Niu
*Assistant Examiner* — Stephen Sutton Kotter
(74) *Attorney, Agent, or Firm* — R. W. McCord Rayburn; Moore & Van Allen PLLC

(57) ABSTRACT

Methods for forming an at least partially oxidized confinement layer of a semiconductor device and corresponding semiconductor devices are provided. The method comprises forming two or more layers of a semiconductor device on a substrate. The layers include an exposed layer and a to-be-oxidized layer. The to-be-oxidized layer is disposed between the substrate and the exposed layer. The method further comprises etching, using a masking process, a pattern of holes that extend through the exposed layer at least to a first surface of the to-be-oxidized layer. Each hole of the pattern of holes extends in a direction that is transverse to a level plane that is parallel to the first surface of the to-be-oxidized layer. The method further comprises oxidizing the to-be-oxidized layer through the pattern of holes by exposing the two or more layers of the semiconductor device to an oxidizing gas to form a confinement layer.

20 Claims, 22 Drawing Sheets

(51) Int. Cl.
   *H01S 5/343* (2006.01)
   *H01S 5/42* (2006.01)
   *H01S 5/042* (2006.01)

(56) References Cited

U.S. PATENT DOCUMENTS

| | | | |
|---|---|---|---|
| 6,159,760 A * | 12/2000 | Goossen | H01S 5/18341 438/33 |
| 9,966,733 B2 | 5/2018 | Feng et al. | |
| 10,396,527 B2 | 8/2019 | Sirbu et al. | |
| 10,601,201 B1 | 3/2020 | Sirbu et al. | |
| 2001/0019569 A1 | 9/2001 | Jayaraman et al. | |
| 2002/0131458 A1 | 9/2002 | Sirbu et al. | |
| 2003/0016714 A1 | 1/2003 | Streubel | |
| 2003/0107034 A1 | 6/2003 | Viktorovitch et al. | |
| 2004/0101009 A1 | 5/2004 | Johnson et al. | |
| 2004/0264531 A1 * | 12/2004 | Ryou | B82Y 20/00 372/45.01 |
| 2005/0158902 A1 * | 7/2005 | Chua | B82Y 20/00 438/32 |
| 2006/0050755 A1 | 3/2006 | Suzuki et al. | |
| 2006/0227835 A1 | 10/2006 | Ueki et al. | |
| 2008/0151959 A1 | 6/2008 | Nakagawa | |
| 2008/0212633 A1 | 9/2008 | Shimizu et al. | |
| 2011/0027924 A1 | 2/2011 | Ikuta | |
| 2011/0027925 A1 * | 2/2011 | Ikuta | H01S 5/18311 372/45.01 |
| 2015/0010034 A1 | 1/2015 | Chang-Hasnain et al. | |
| 2015/0288146 A1 | 10/2015 | Chang-Hasnain et al. | |
| 2016/0079736 A1 | 3/2016 | Yvind et al. | |
| 2017/0070033 A1 | 3/2017 | Hayakawa et al. | |
| 2017/0093128 A1 | 3/2017 | Fattal et al. | |
| 2018/0011248 A1 | 1/2018 | Bourstein et al. | |
| 2020/0280175 A1 * | 9/2020 | Lee | H01S 5/423 |
| 2021/0305783 A1 | 9/2021 | Kalifa et al. | |
| 2022/0271499 A1 | 8/2022 | Berk et al. | |

OTHER PUBLICATIONS

Ayar Labs; Solution Brief; Paradigm Change: Reinventing HPC Architecture with In-Package Optical I/O; dated Jul. 20, 2020; downloaded from: https://insidehpc.com/2020/07/paradigm-change-reinventing-hpc-architectures-with-in-package-optical-i-o/; 9 pages.

Bollani, M. et al.; "Selective Area Epitaxy of GaAs/Ge/Si Nanomembranes: A Morphological Study", Crystals 2020, 10(2), 57; https://doi.org/10.3390/cryst10020057; 9 pages.

Cooke, Mike, Semiconductor Today Compounds & Advanced Silicon, vol. 9, Issue 10, Dec. 2014/Jan. 2015, http://dx.doi.org/10.7567/.

Feng, Milton et al., "Oxide-Confined VCSELs for High-Speed Optical Interconnects", IEEE Journal of Quantum Electronics vol. 54, Issue 3: (Jun. 3, 2018).

Ferrara, J. et al.; "Heterogeneously Integrated Long-Wavelength VCSEL using High-Contrast Grating on Silicon", CLEO:2014 © 2014 OSA; 2 pages.

Fukushima, T. et al.; "New Three-Dimensional Integration Technology Using Chip-to-Wafer Bonding to Achieve Ultimate Super-Chip Integration"; Japanese Journal of Applied Physics, vol. 45, Part 1, No. 4B, 2006; pp. 3030-3035.

Huffaker, D. L. et al.; "Sealing AlAs Against Oxidative Decomposition and its Use in Device Fabrication," in CLEO'96, Anaheim, No. JTuH5; pp. 206-207.

Moser, P. et al.; "81 fJ/bit energy-to-data ratio of 850 nm vertical-cavity surface-emitting lasers for optical interconnects," Applied Physics Letters, vol. 98, No. 23, pp. 231106-231106-3, 2011.

Muller, M.; et al.; "1550-nm High-Speed Short-Cavity VCSELs," IEEE Journal of Selected Topics in Quantum Electronics, vol. 17, No. 5, pp. 1158-1166, 2011.

Non-Final Rejection for U.S. Appl. No. 16/828,764, dated Jun. 24, 2021, 26 pages.

Ohno, Y. et al.; "Chemical bonding at room temperature via surface activation to fabricate low-resistance GaAs/Si heterointerfaces", Applied Surface Science, vol. 525, Sep. 30, 2020, 146610; 5 pages.

Park, M. et al., "Hetero-integration Enables Fast Switching Time-Of-Flight Sensor for Light Detection and Ranging"; Scientific Reports; NatureResearch; 2020; 10:2764; pp. 1-8.

Persano, A. et al.; "Thin Film Encapsulation for RF MEMS in 5G and Modern Telecommunication Systems", Sensors (Basel). Apr. 2020; 20(7): 2133, 10.3390/s20072133; 12 pages.

Qiao, P. et al.; "Wavelength-Swept VCSELs"; IEEE Journal of Selected Topics in Quantum Electronics, vol. 23, No. 6, Nov./Dec. 2017; 16 pages; DOI:10.1109/JSTQE.2017.2707181.

Sarmiento, T. et al., "Continuous-Wave Operation of GaAs-based 1.5 um GaInNAsSb VCSELs", IEEE Phot. Tech. Lett, vol. 31, N8, (Aug. 2019).

Sirbu, A. et al., "Wafer-fused heterostructures: application to vertical cavity surface-emitting lasers emitting in the 1310 nm band", Semicond. Sci. Technol.26, 014016 (2011).

Sirbu, A. et al.; "Reliability of 1310 nm Wafer Fused VCSELs", IEEE Photonics Technology Letters, vol. 25, (16), pp. 1555-1558, 2013.

Suzuki, J. et al.; "Introduction of AlInAs-oxide current-confinement structure into GaInAsP/SOI hybrid Fabry-Pérot laser", Japanese Journal of Applied Physics 56, 062103 (2017).

NonFinal Office Action for U.S. Appl. No. 17/249,224, dated Oct. 5, 2022, (13 pages), United States Patent and Trademark Office, US.

German Office Action from corresponding German Application No. 10 2022 204 886.5 dated Oct. 12, 2023, 6 pages, with English Translation.

Office Action from corresponding German Application No. 10 2022 204 886.5 dated Feb. 14, 2024, 4 pages, with English Translation.

* cited by examiner

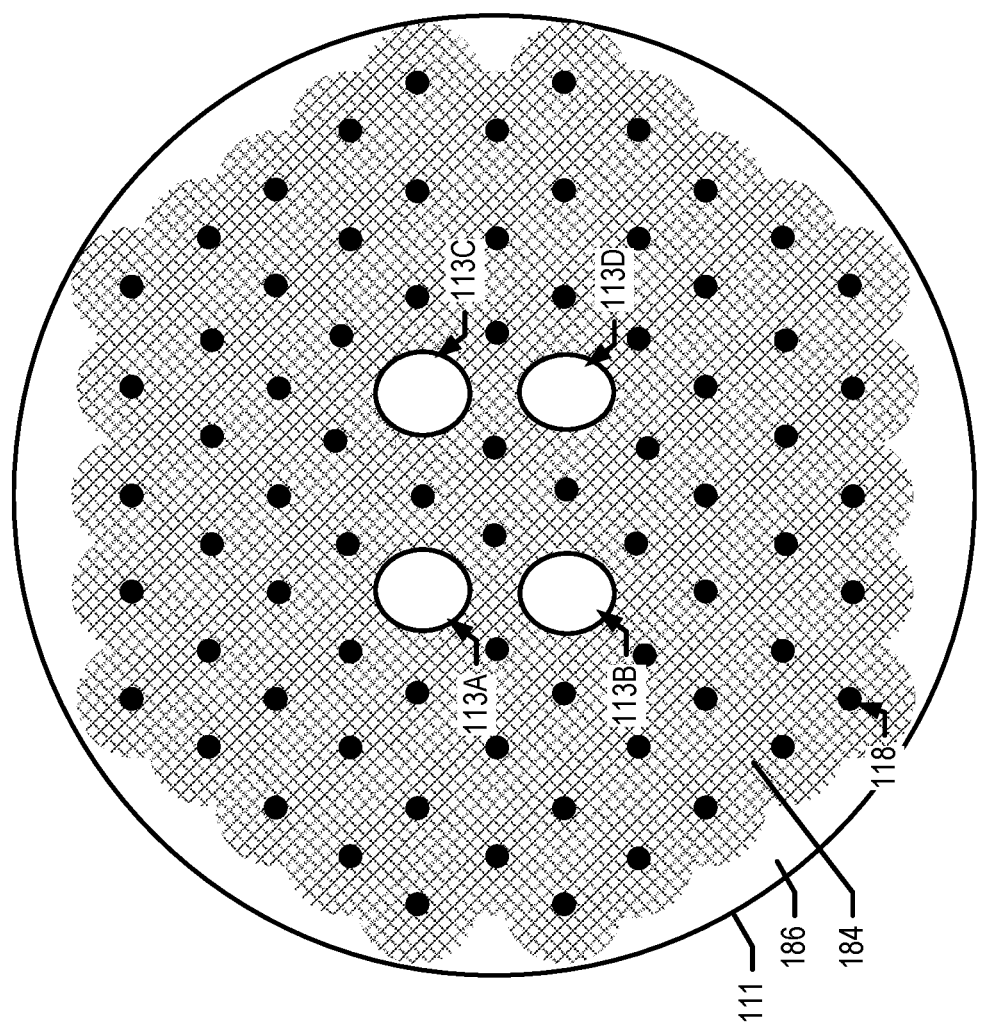

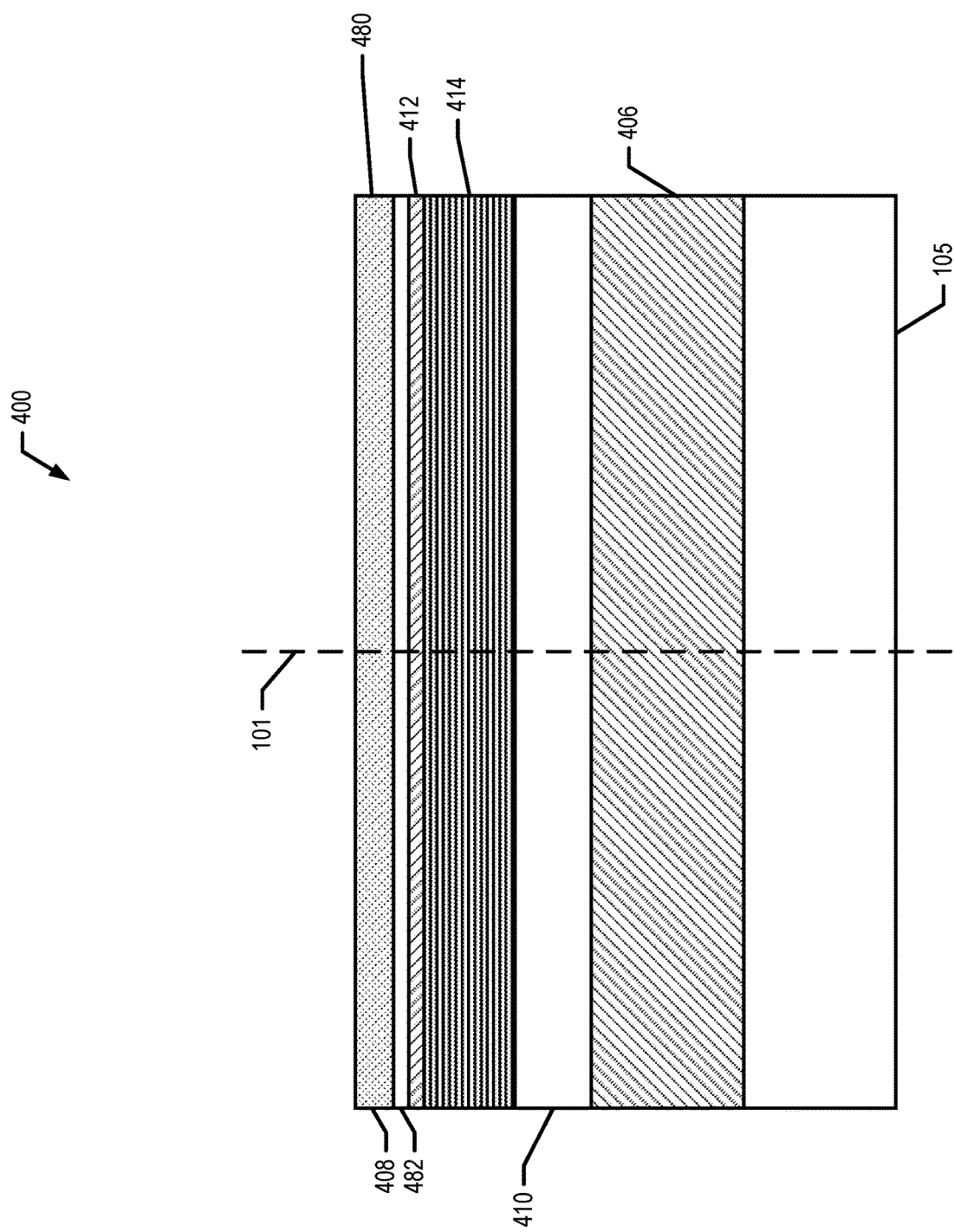

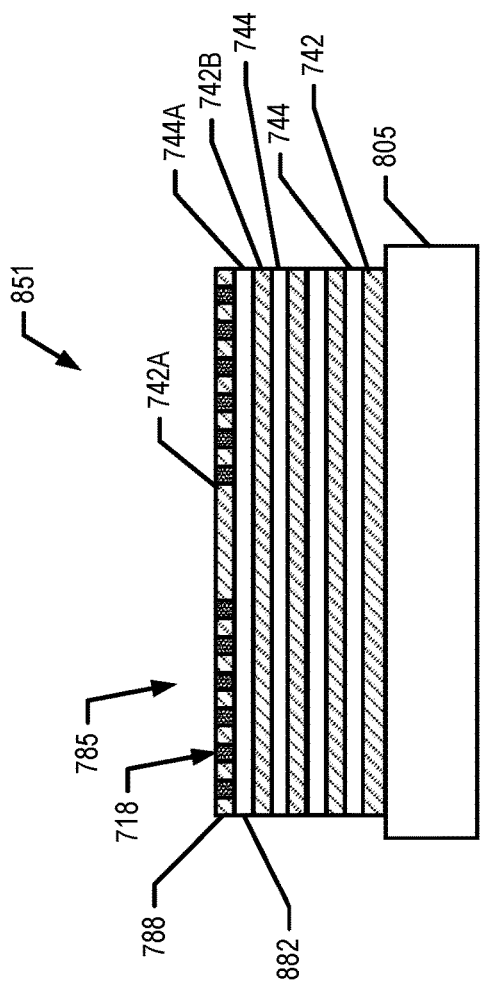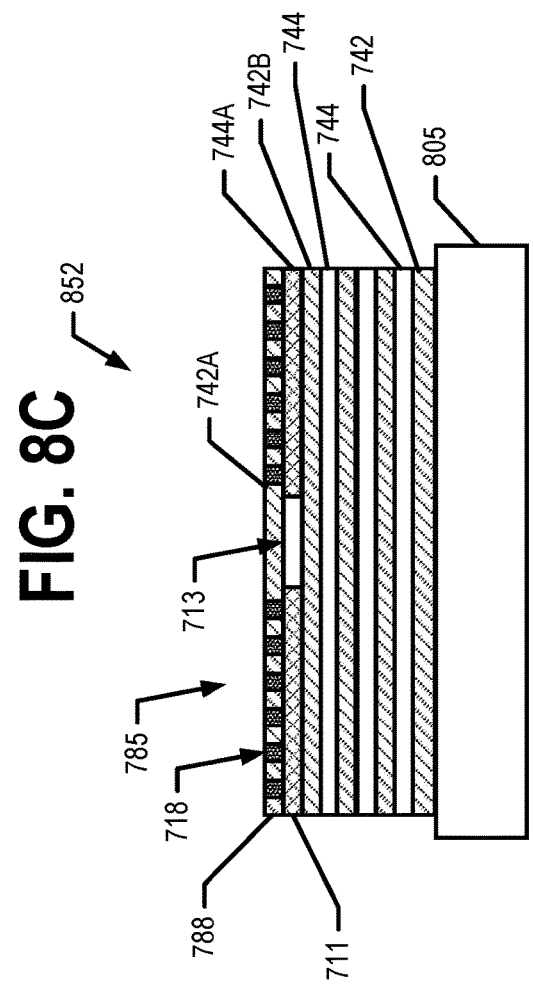

US 12,334,711 B2

FABRICATING SEMICONDUCTOR DEVICES, SUCH AS VCSELs, WITH AN OXIDE CONFINEMENT LAYER

TECHNICAL FIELD

Various embodiments relate to the fabrication of semiconductor devices that include an oxide confinement layer. Various embodiments relate to the fabrication of vertical-cavity surface-emitting layers (VCSELs) having respective oxide confinement layers.

BACKGROUND

Various semiconductor devices, such as VCSELs, LED and photodiodes, for example, include components configured to provide lateral electrical and/or optical confinement. For example, in VCSELs, a buried tunnel junction may be used to provide lateral electrical and/or optical confinement. In some VCSELs, one or more layers of the VCSEL are oxidized inward from about a perimeter of the VCSEL to from an oxidized layer that may be used to provide lateral electrical and/or optical confinement.

BRIEF SUMMARY

Lateral electrical and/or optical confinement within VCSELs is used to control the electric field within the active region of the VCSEL such that the active region will generate sufficient optical power for lasing activity. In various VCSELs, a variety of methods have been used to provide appropriate lateral electrical and/or optical confinement, such as use of a buried tunnel junction, oxide confinement, and ion implantation regions (see, for example, U.S. patent application Ser. No. 17/249,224, filed Feb. 24, 2021, the content of which is hereby incorporated by reference in its entirety). Similar lateral electrical and/or optical confinement is required within various other semiconductor devices.

As noted above, in some VCSELs, one or more layers of the VCSEL are oxidized inward from about a perimeter of the VCSEL mesa to provide appropriate lateral electrical and/or optical confinement for the intended application of the VCSEL. In other words, one or more layers of the VCSEL are oxidized from an outer edge of the layer in toward a middle portion of the layer. However, such an oxidization process does not work for a wide range of materials. For example, layers of InAlGaAs and/or InAlAs cannot be effectively oxidized from the outer edge of the layer in toward a middle portion of the layer due to the oxygen not being able to penetrate from the outer edge in a sufficient depth toward the middle portion of the layer to perform the oxidization. Additionally, such oxidization procedures (e.g., oxidizing from a peripheral edge into a middle portion of the layer) does not allow for formation of multiple apertures with high accuracy control of the shape or location of the aperture in the confinement layer. Thus, technical problems exist relating to oxidizing layers of material through which oxygen mobility is low and controlling the shape and/or location of an aperture in an oxidized confinement layer of a semiconductor device.

Embodiments of the present invention provide technical solutions to these technical problems. In particular, various embodiments provide methods for fabricating semiconductor devices having an oxidized confinement layer that includes a material with low oxygen mobility and/or one or more apertures (e.g., portions of the confinement layer that are not oxidized) for which the location, size, and/or shape of the apertures are controlled. In various embodiments, the semiconductor devices are VCSELs, photodiodes, and/or other semiconductor devices within which lateral electrical and/or optical confinement is desired and/or required.

In various embodiments, the method comprises forming a plurality of layers of the semiconductor device on a substrate. In various embodiments, the plurality of layers includes at least two layers—a to-be-oxidized layer and an exposed layer. The to-be-oxidized layer is disposed between the exposed layer and the substrate, and the exposed layer has a first surface that is exposed to the surrounding environment. For example, the exposed layer is formed on the to-be-oxidized layer such that a second surface of the exposed layer abuts, is immediately adjacent to, and/or is formed on a first surface of the to-be-oxidized layer. The first surface of the exposed layer has not (yet) had another layer formed thereon.

In an example embodiment, the method comprises forming a pattern of holes through the exposed layer at least to the first surface of the to-be-oxidized layer. For example, the pattern of holes comprises a plurality of holes that are formed (e.g., etched) through the exposed layer from the first surface of the exposed layer through to the second surface of the exposed layer. The partial and/or in-process semiconductor, comprising the substrate, the to-be-oxidized layer, the exposed layer having the pattern of holes formed therethrough, and possibly other layers between the substrate and the to-be-oxidized layer, is then exposed to an oxidizing gas (e.g., a gas comprising water vapor). The oxidizing gas oxidizes a portion of the to-be-oxidized layer to form a confinement layer having one or more apertures defined therein where the material of the to-be-oxidized layer was not oxidized. In various embodiments, the location and shape of the one or more apertures are defined by the pattern of holes.

According to an aspect of the present disclosure, a method for forming an at least partially oxidized confinement layer of a semiconductor device is provided. The method includes forming two or more layers of a semiconductor device on a substrate. The two or more layers include an exposed layer and a to-be-oxidized layer. The to-be-oxidized layer is disposed between the substrate and the exposed layer. The method further comprises etching, using a masking process, a pattern of holes that extend through the exposed layer at least to a first surface of the to-be-oxidized layer. The first surface of the to-be-oxidized layer is a surface of the to-be-oxidized layer that is generally parallel to a level plane defined by a surface of the substrate that is closest to the exposed layer. Each hole of the pattern of holes extends in a direction that is transverse to the level plane. The method further comprises oxidizing the to-be-oxidized layer through the pattern of holes by exposing the two or more layers of the semiconductor device to an oxidizing gas to form a confinement layer.

In an example embodiment, the two or more layers further comprise at least one active layer comprising an InP-based material. In an example embodiment, the to-be-oxidized layer comprises InAlGaAs and/or InAlAs and the confinement layer comprises oxidized InAlGaAs and/or InAlAs. In an example embodiment, each hole of the pattern of holes has at least one closest neighbor that is located no more than ten microns from the hole. In an example embodiment, each hole of the pattern of holes has a diameter in the range of 0.5 to 5 microns.

In an example, embodiment, the semiconductor device is a vertical-cavity surface-emitting laser (VCSEL), the two or more layers comprise a first reflector and an active region, and the first reflector is disposed between the substrate and the active region. The VCSEL further comprises a second reflector, and the active region is disposed between the first reflector and the second reflector. In an example embodiment, the to-be-oxidized layer is one of (a) a spacer layer disposed between the active region and the second reflector or (b) a layer of the second reflector. In an example embodiment, the VCSEL is configured to emit light of a characteristic wavelength in a range of 1200-2000 nm. In an example embodiment, the method further comprises, after forming the confinement layer, forming or bonding the second reflector onto the exposed layer. In an example embodiment, after the forming or bonding of the second reflector on to the exposed layer, the exposed layer still comprises the pattern of holes. In an example embodiment, the confinement layer comprises at least one aperture portion, the aperture portion being an unoxidized portion of the confinement layer that defines an electro-optical aperture of the VCSEL. In an example embodiment, a shape of the aperture portion defines an optical beam profile and polarization of light emitted by the VCSEL. In an example embodiment, the at least one aperture portion comprises two or more aperture portions, wherein the VCSEL is configured to emit light through two or more optical apertures, each of the two or more optical apertures defined by a respective one of the two or more aperture portions. In an example embodiment, the at least one aperture portion is defined by the pattern of holes. In an example embodiment, the pattern of holes defines a shape and a pattern of at least one electro-optical aperture of a single- and/or multi-mode VCSEL configuration.

According to another aspect, a VCSEL is provided. In an example embodiment, the VCSEL includes a first reflector formed on a substrate; a second reflector; an active region disposed between the first reflector and the second reflector; a confinement layer; and a patterned layer. The confinement layer comprises an oxidized pattern and at least one aperture portion. The aperture portion is an unoxidized portion of the confinement layer that defines an electro-optical aperture of the VCSEL. The patterned layer comprises a pattern of holes that corresponds to the oxidized pattern.

In an example embodiment, the at least one aperture portion comprises two or more aperture portions and the VCSEL is configured to emit light through two or more optical apertures, each of the two or more optical apertures corresponding to a respective one of the two or more aperture portions. In an example embodiment, the confinement layer and the patterned layer are immediately adjacent layers and are disposed (a) between the active region and the second reflector or (b) within the second reflector. In an example embodiment, a shape of the aperture portion defines an optical beam profile and polarization of light emitted by the VCSEL through the optical aperture. In an example embodiment, the VCSEL is configured to emit light of a characteristic wavelength in a range of 1200-2000 nm.

BRIEF DESCRIPTION OF THE DRAWING(S)

Having thus described the invention in general terms, reference will now be made to the accompanying drawings, which are not necessarily drawn to scale, and wherein:

FIG. 2B illustrates a schematic cross-sectional view of a VCSEL having a plurality of apertures taken in a plane substantially perpendicular to the emission axis of the VCSEL, in accordance with another example embodiment;

Figure 1:
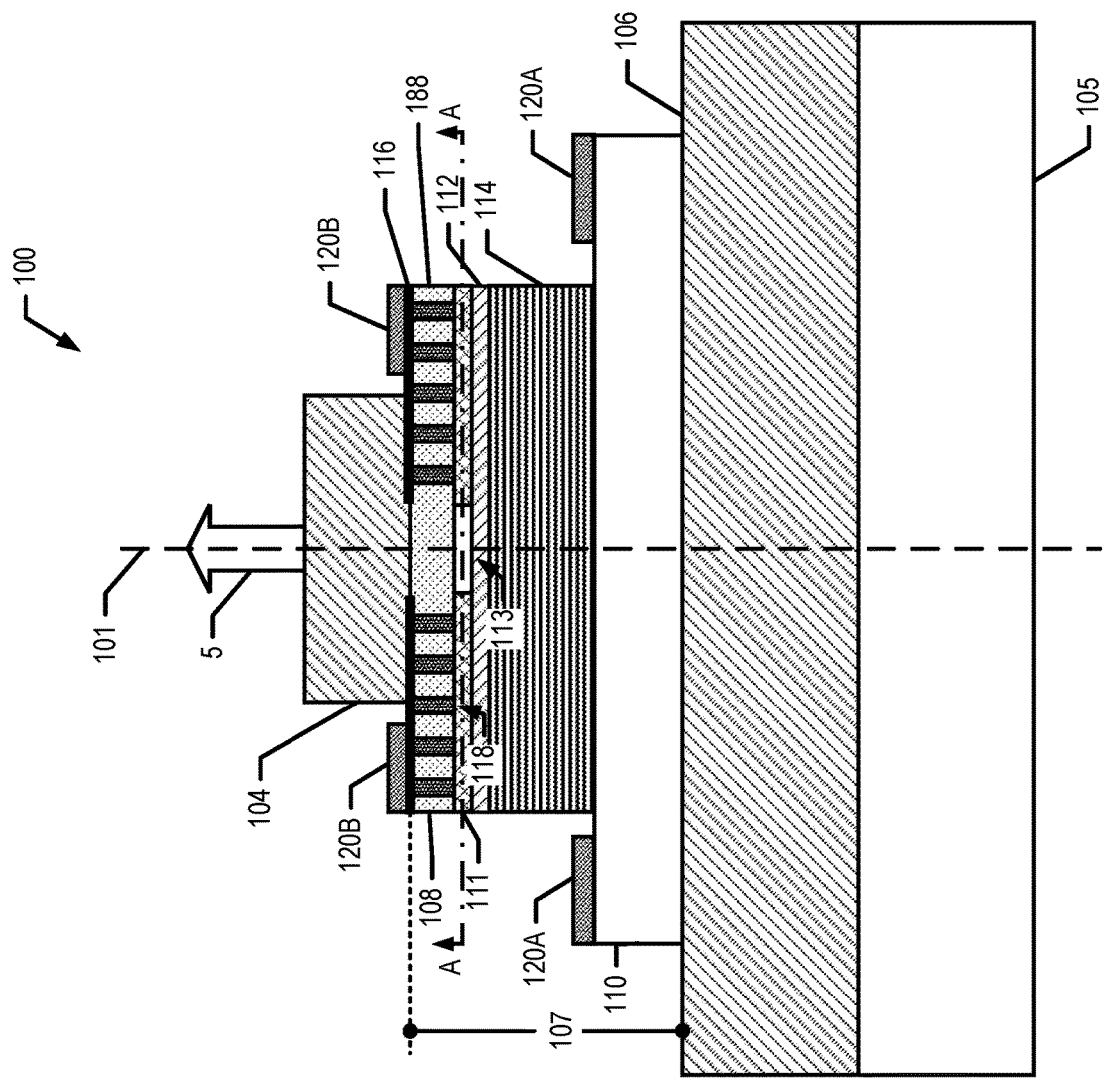
FIG. 1 illustrates a schematic cross-sectional view of a vertical-cavity surface-emitting laser (VCSEL) taken in a plane substantially parallel to the emission axis of the VCSEL, in accordance with an example embodiment.
Figure 3:
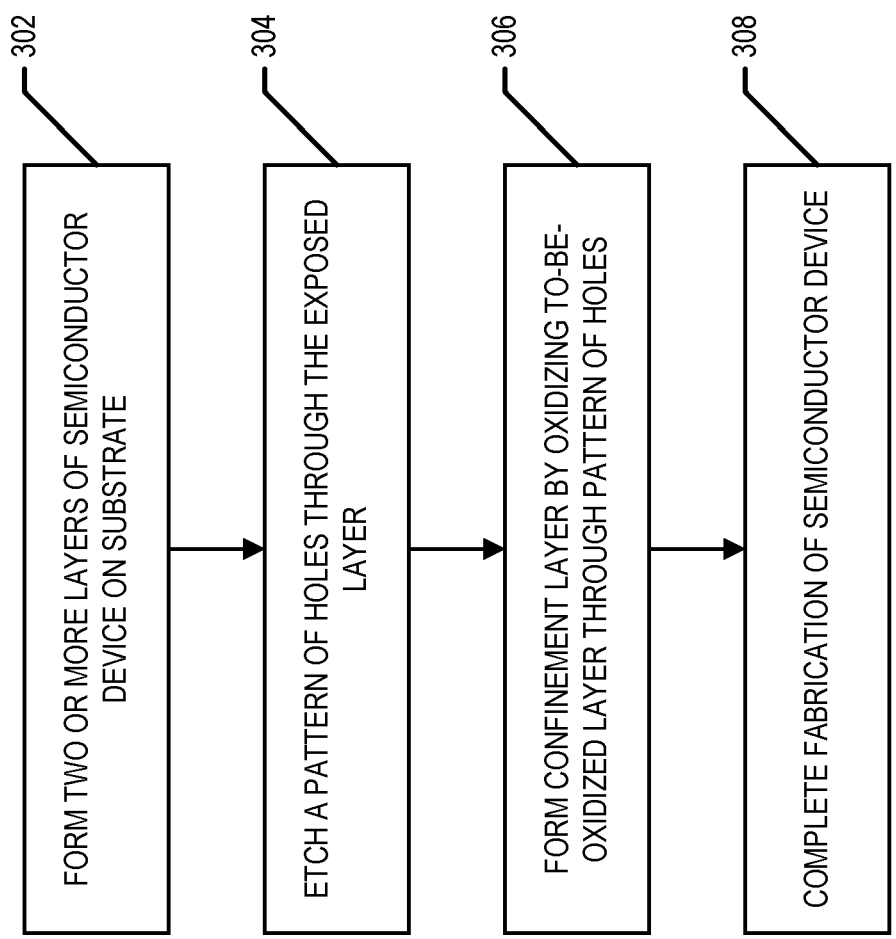
Figure 4B:
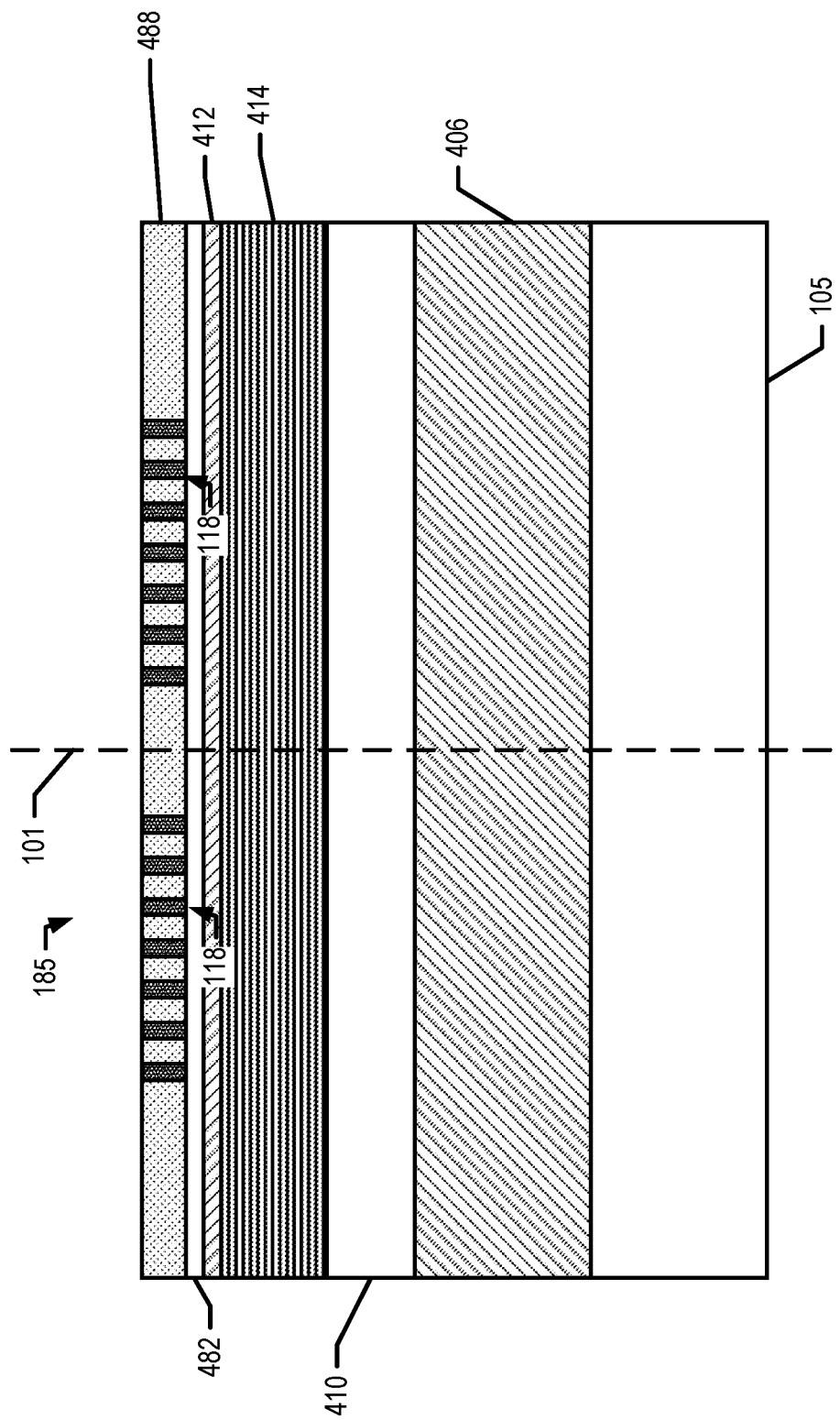
Figure 4C:
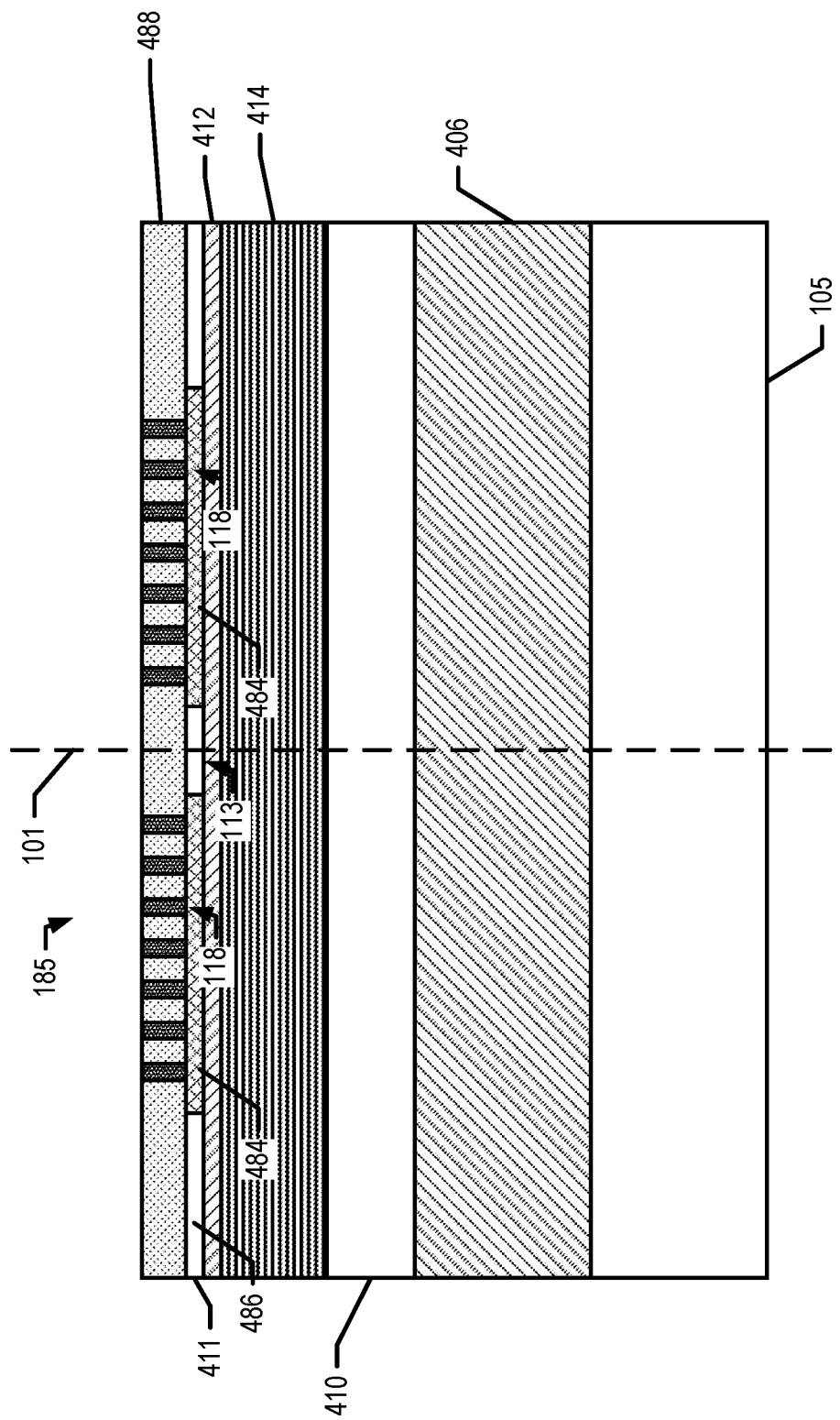
Figure 5:
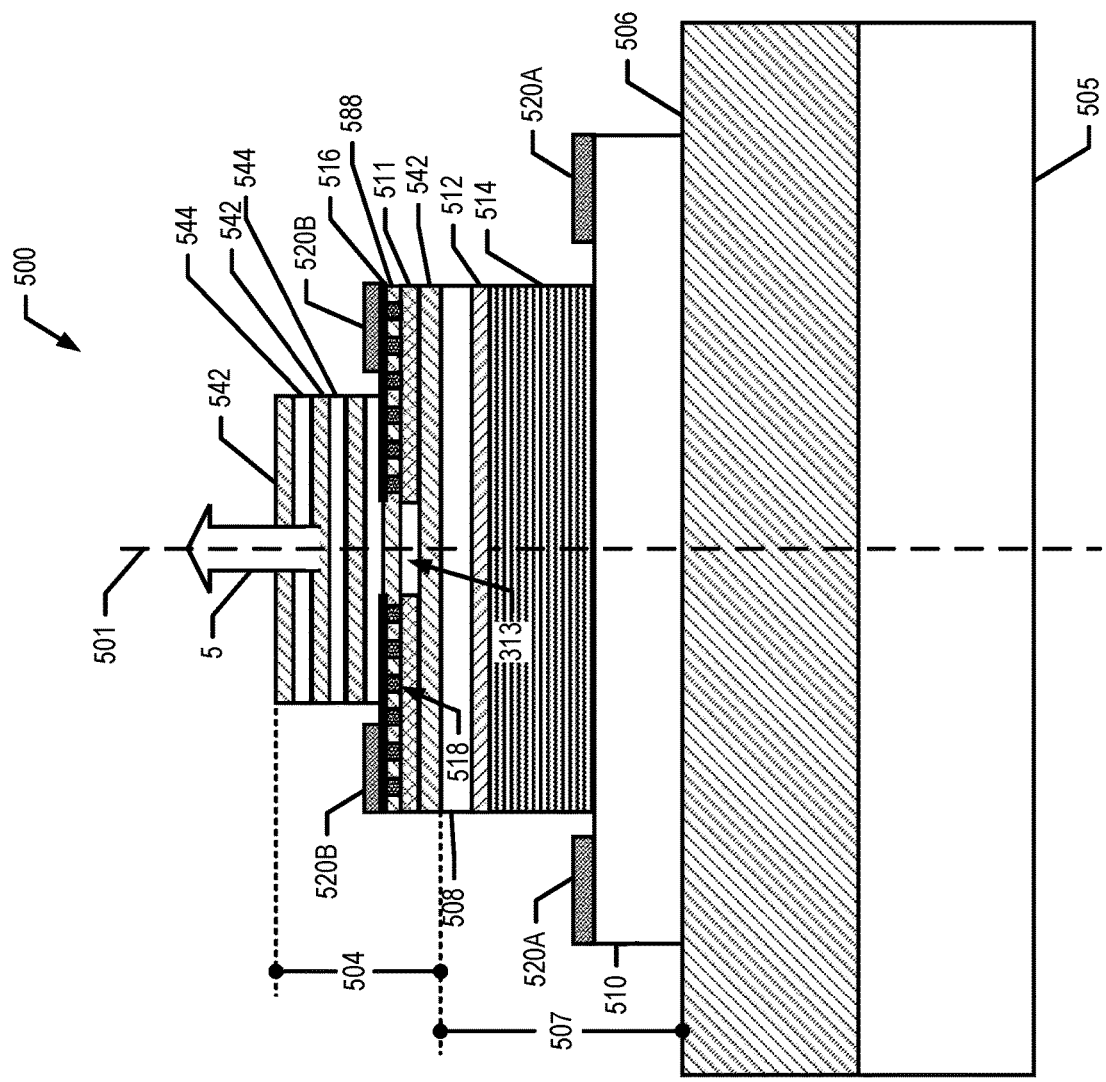
Figure 6A:
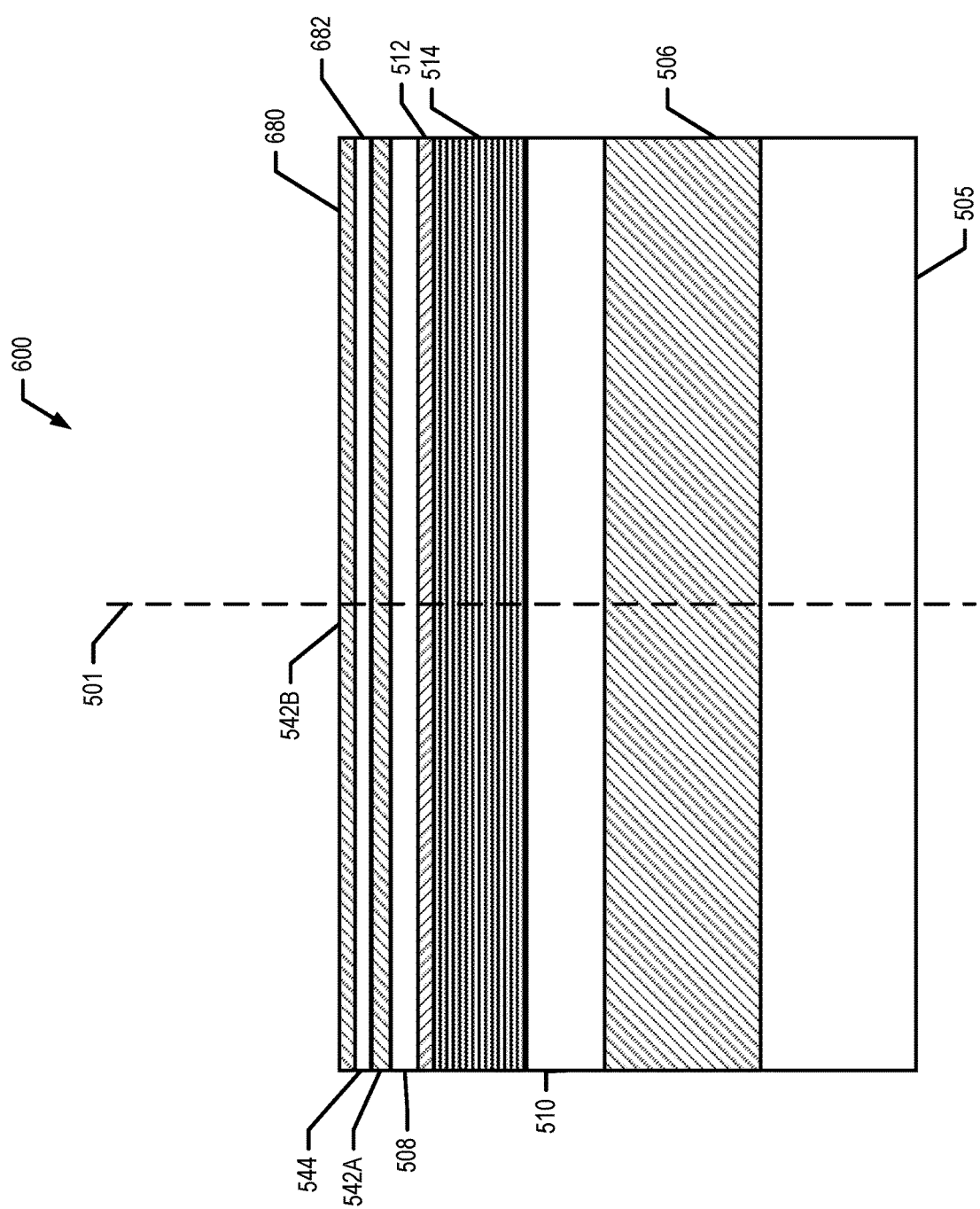
Figure 6B:
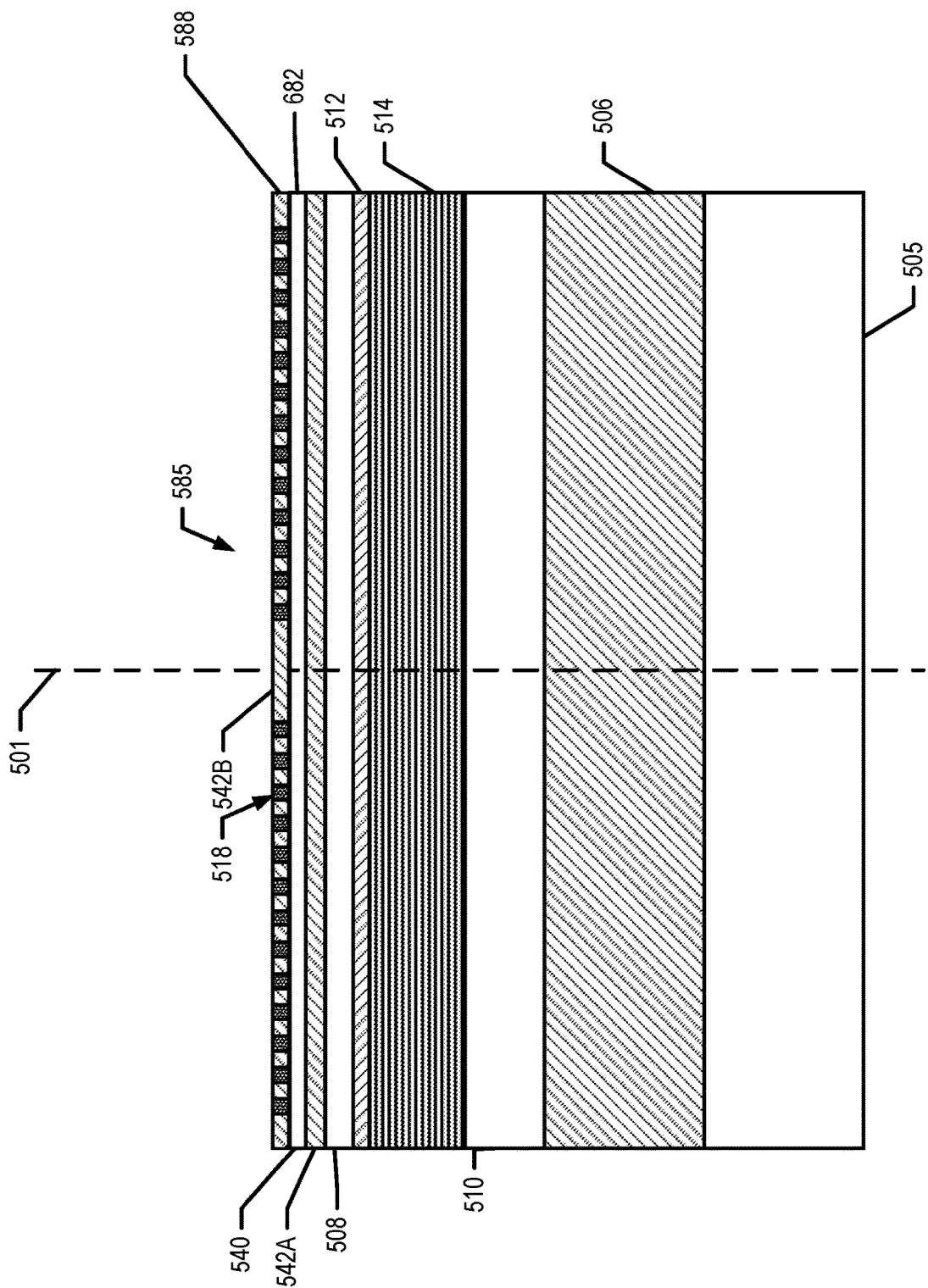
Figure 6C:
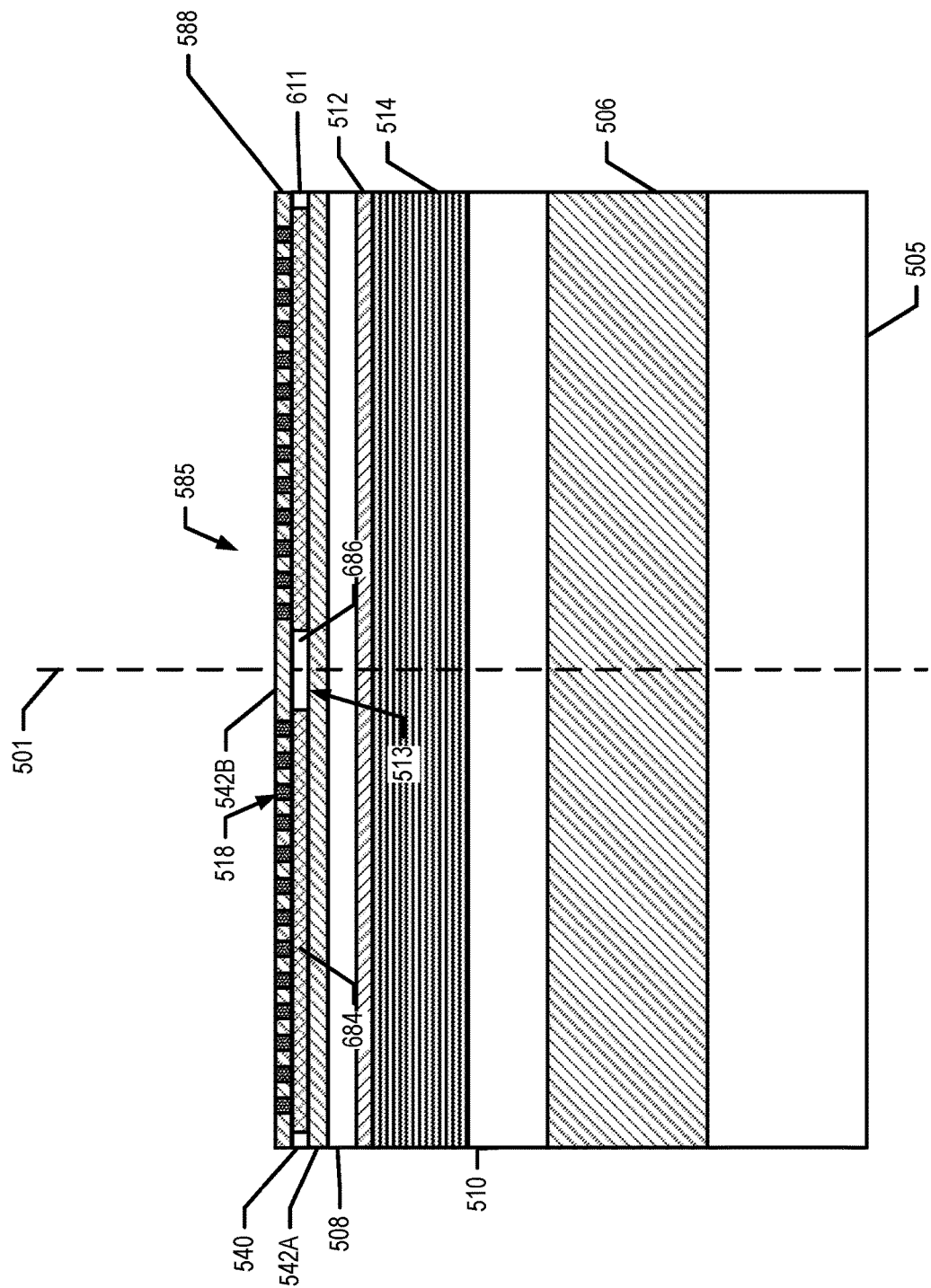
Figure 7:
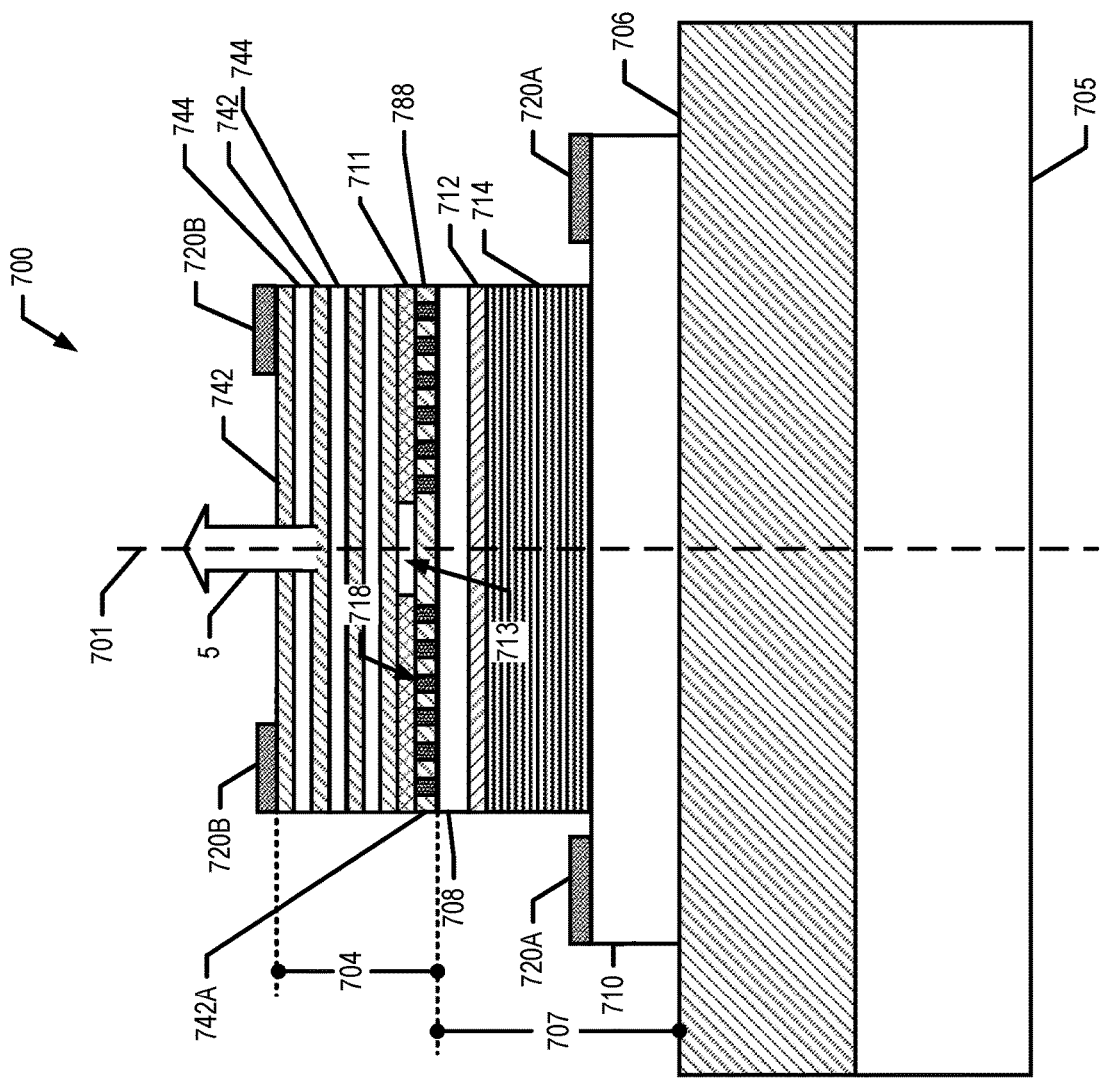
Figure 8A:
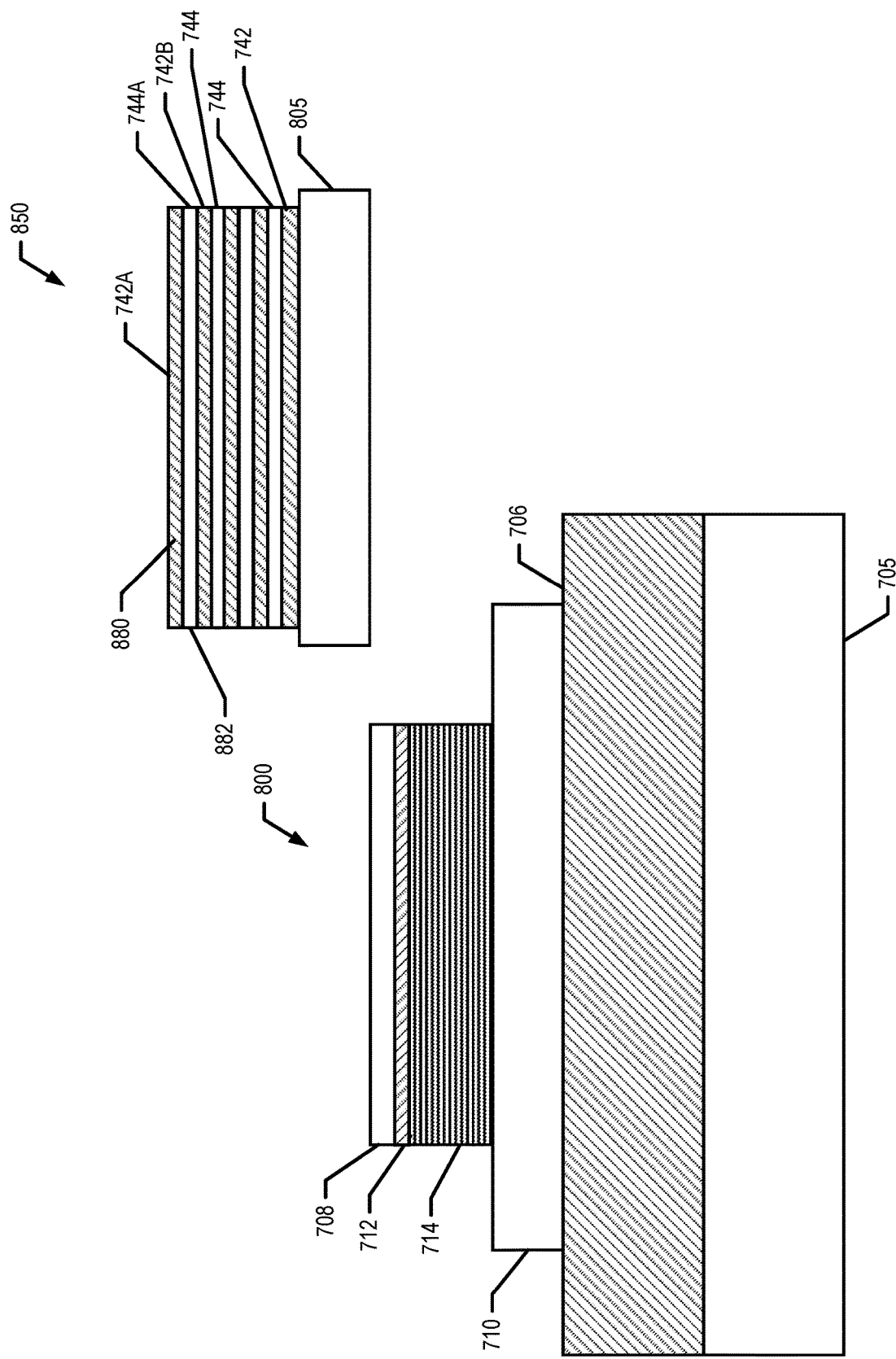
Figure 9:
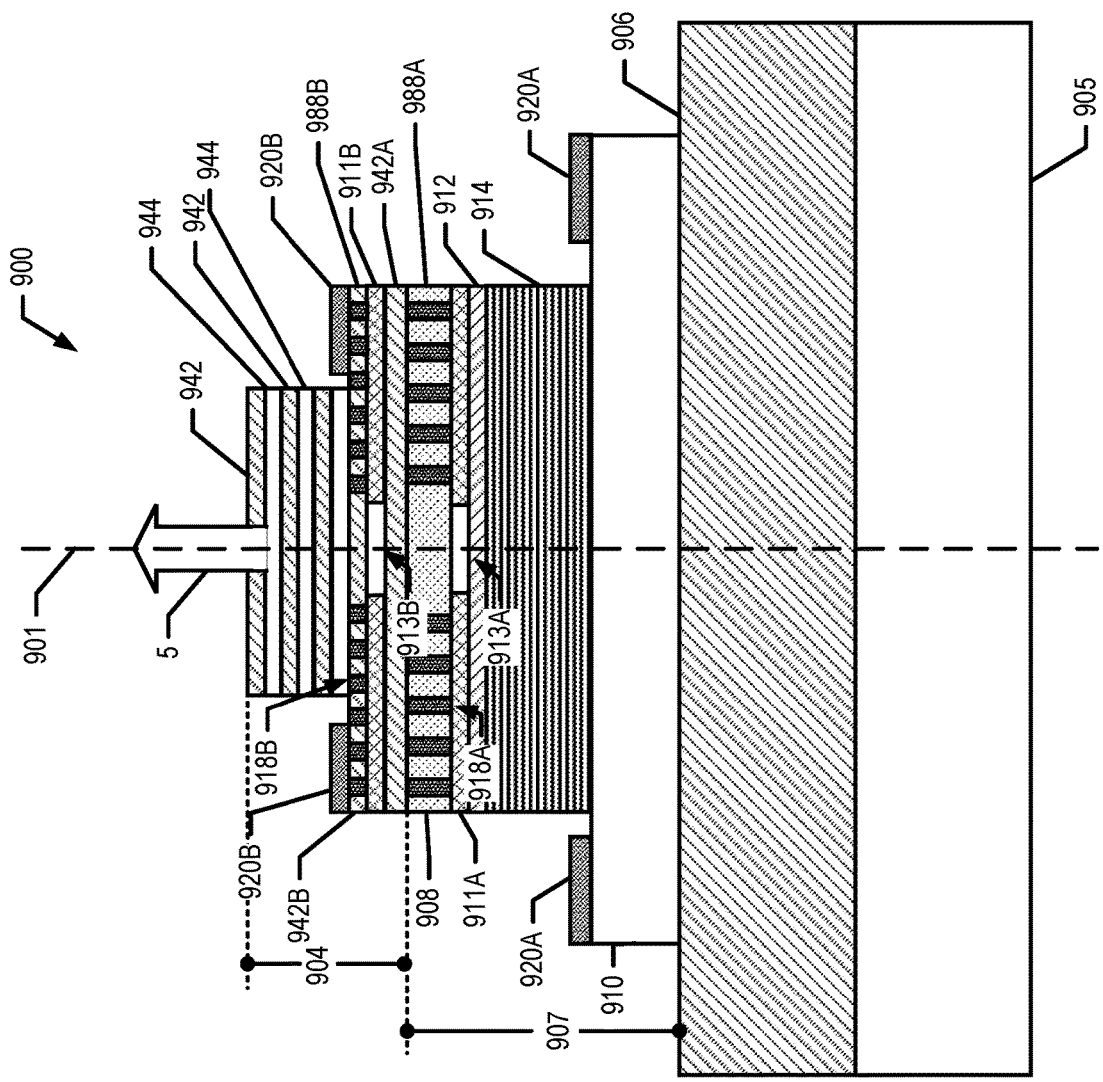
Figure 10:
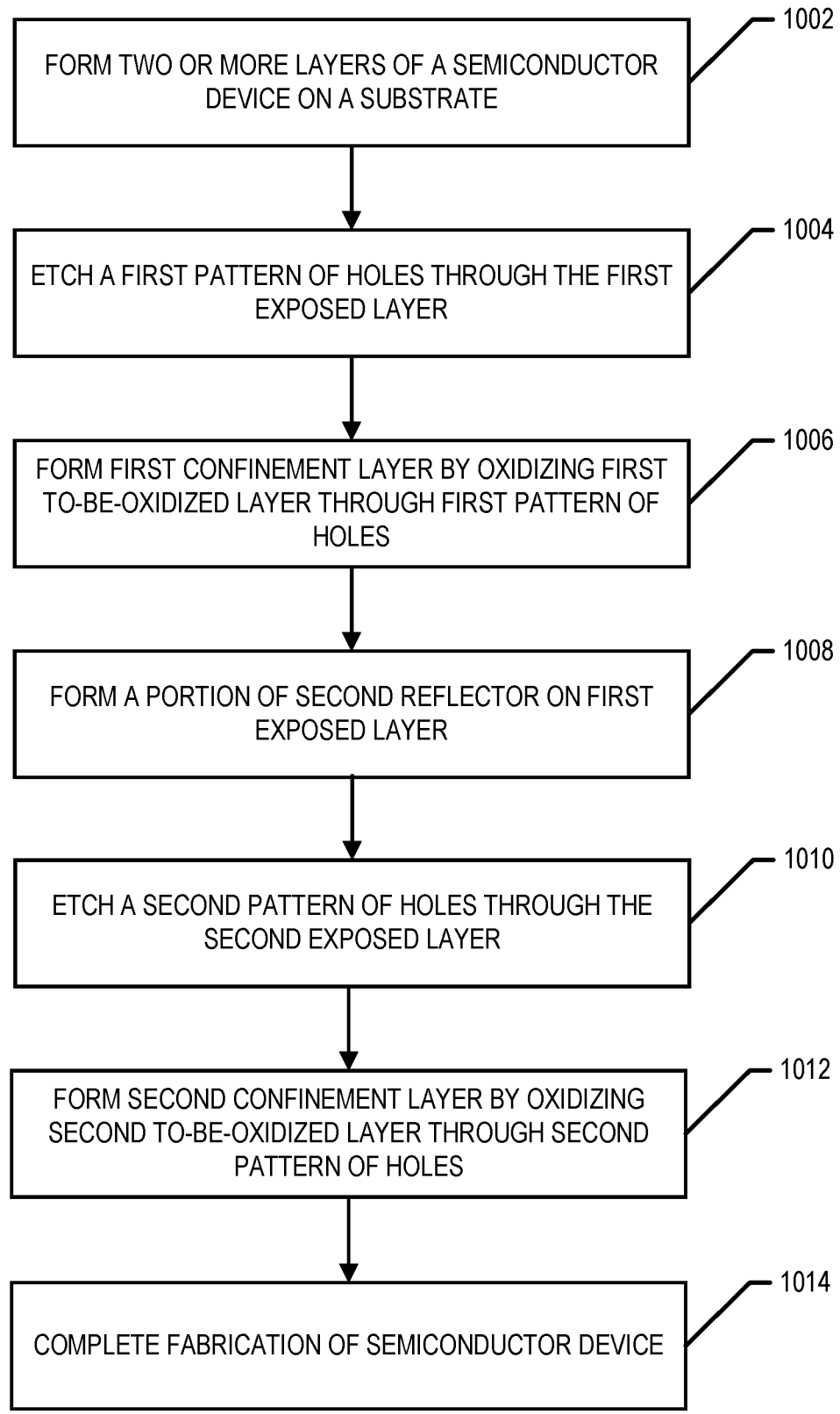

FIG. 3 provides a flowchart illustrating various processes, procedures, and/or operations for fabricating a semiconductor having a confinement layer, in accordance with an example embodiment;

FIGS. 4A-4C illustrate some of the steps of fabricating a VCSEL such as the VCSEL illustrated in FIG. 1, according to an example embodiment;

FIG. 5 illustrates a schematic cross-sectional view of a VCSEL taken in a plane substantially parallel to the emission axis of the VCSEL, in accordance with another example embodiment;

FIGS. 6A-6C illustrate some of the steps of fabricating a VCSEL such as the VCSEL illustrated in FIG. 5, according to an example embodiment;

FIG. 7 illustrates a schematic cross-sectional view of a VCSEL taken in a plane substantially parallel to the emission axis of the VCSEL, in accordance with still another example embodiment;

FIGS. 8A-8C illustrate some of the steps of fabricating a VCSEL such as the VCSEL illustrated in FIG. 7, according to an example embodiment;

FIG. 9 illustrates a schematic cross-sectional view of a VCSEL taken in a plane substantially parallel to the emission axis of the VCSEL, in accordance with yet another example embodiment;

FIG. 10 provides a flowchart illustrating various processes, procedures, and/or operations for fabricating a semiconductor having multiple confinement layers, in accordance with an example embodiment; and FIGS. 11A-11F illustrate some of the steps of fabricating a VCSEL having multiple confinement layers such as the VCSEL illustrated in FIG. 9, according to an example embodiment.

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. As used herein, the terms "approximately" and "substantially" refer to within tolerances within appropriate manufacturing and/or engineering standards.

Various embodiments provide methods for fabricating semiconductor devices having a confinement layer. The confinement layer comprises one or more apertures having respective locations and/or shapes that are controlled by a pattern of holes through which a to-be-oxidized layer is oxidized to form the confinement layer. Various embodiments provide semiconductor devices, such as VCSELs, photodiodes, and/or the like, fabricated to have a confinement layer comprising one or more apertures having respective locations and/or shapes that are controlled by oxidation through a pattern of holes. Four example embodiments of such VCSELs will now be described along with an example method for fabricating such VCSELs. As should be understood, while various embodiments are described with respect to VCSELs, VCSELs are an example of various semiconductor devices that may be fabricated using various embodiments for fabricating a confinement layer via a pattern of holes.

A First Example VCSEL

FIG. 1 illustrates a cross-section of an example embodiment of a vertical-cavity surface-emitting laser (VCSEL) 100 where the cross-section is taken in a plane comprising the emission axis 101 (e.g., in a plane substantially parallel to the emission axis 101). The first example VCSEL 100 is a VCSEL comprising a patterned InP layer comprising a pattern of holes through which an oxidized layer was oxidized to form an electrical and/or optical aperture of the VCSEL. In various embodiments, a VCSEL 100 is configured to emit light 5 for use in a variety of applications, such as fiber optic data transmission in high-speed fiber optic communication systems. In various embodiments, the VCSEL 100 is configured to emit light having a characteristic wavelength in 910-2000 nm or in the 1200-2000 nm wavelength range. The VCSEL 100 is formed and/or fabricated on a substrate 105, such as a silicon substrate, a GaAs substrate, and/or other appropriate substrate.

In various scenarios, a plurality of VCSELs 100 may be generated on a large substrate 105 (e.g., a wafer). In an example embodiment, the substrate (e.g., wafer) has at least one dimension (e.g., length, width, or radius) larger than two inches. Once fabrication of one or more VCSELs and/or other electro and/or optical devices are fabricated on the substrate, the substrate (e.g., wafer) may be diced into multiple chips. For example, the VCSELs 100 and/or electro-optical systems formed on the substrate (e.g., wafer) may be separated via a dicing procedure, used as an array of VCSELs, incorporated into an integrated VCSEL system, and/or the like, as appropriate for the application.

The structure of the VCSEL 100 includes an active material structure disposed between two reflectors. For example, FIG. 1 illustrates the active material structure 107 disposed between a first reflector 106 and a second reflector 104. In various embodiments, the active material structure 107 is configured to be operable to generate light of a characteristic wavelength. In various embodiments, the first and second reflector 106, 104 form a cavity therebetween configured to cause the light generated by active material structure 107 to be emitted as a laser beam and/or laser pulses. For example, the VCSEL 100 may emit light 5 through the second reflector 104 or through the first reflector 106, as appropriate for the application. For example, the VCSEL 100 is configured to be "flip-chip" mounted and emit light through the first reflector 106 and the substrate 105, in an example embodiment. In another embodiment, the VCSEL 100 is configured to emit light 5 through the second reflector 104, as shown in FIG. 1. In various embodiments where the light is emitted through first reflector 106 into the substrate or coupled to a waveguide (e.g., silicon waveguide and/or another waveguide), for example, the emission wavelength of light 5 for the VCSEL 100 is in the range of 1100-2000 nm. As can be seen in FIG. 1 the direction in which light 5 is emitted from the VCSEL 100 defines an emission axis 101 of the VCSEL. In various embodiments, the VCSEL 100 is generally rotationally and/or radially symmetric about the emission axis 101. In various embodiments, the emission direction can be configured towards first reflector 106 (e.g., in a bottom emitting and/or flip-chip configuration).

In various embodiments, the first reflector 106 and/or the second reflector 104 comprise reflector stacks (e.g., dielectric layer stacks). For example, the first reflector 106 and/or the second reflector 104 may comprise un-doped semiconductor distributed Bragg reflector (DBR) mirrors. For example, the first reflector 106 and/or the second reflector 104 may comprise un-doped alternating layers of aluminum gallium arsenide (AlGaAs) and gallium arsenide (GaAs). In various embodiments, the second reflector 104 may comprise a DBR mirror and the first reflector 106 may comprise a micro-electromechanical systems (MEMS) component. For example, a MEMS component may be fabricated on the substrate 105 to form the first reflector 106. In an example embodiment, the first reflector 106 comprises a MEMS high-contrast grating (HCG). In various embodiments, the first reflector 106 may be a hybrid reflector comprising a combination of MEMS components and reflector stacks, such as DBR mirrors.

In various embodiments, a MEMS HCG comprises a thin element having a grating pattern thereon/therein with the period of the grating pattern being smaller than the characteristic wavelength of the corresponding VCSEL 100. In such embodiments, the grating pattern is formed in a first material and is surrounded by and/or embedded in a second material, where the second material has a lower index of refraction than the first material. In various embodiments in which the first reflector 106 comprises a MEMS component (e.g., a MEMS HCG), the MEMS component may be fabricated with lateral coupling functionality such that it is possible to directly couple the light 5 emitted by the VCSEL in one lateral direction or in both lateral directions. In various embodiments, a lateral direction is a direction that is substantially parallel to a plane defined by a surface of the substrate 105. For example, the MEMS component of the first reflector 106 (e.g., MEMS HCG and/or the like) may be used to optically couple the VCSEL to another optical and/or electro-optical component formed on and/or mounted to the substrate 105.

In various embodiments, the first reflector 106 may be operable to and/or configured to control the shape and/or polarization of the beam and/or pulse of light 5 emitted by the VCSEL 100. In various embodiments, the first reflector 106 may be operable to and/or configured to tune the wavelength of light emitted by the VCSEL 100.

The active material structure 107 may be sandwiched between the first and second reflectors 106, 104 and may comprise an active region 114. In various embodiments, the active region 114 comprises a stack of quantum well and/or quantum dot layers. In an example embodiment, the active region 114 comprises one or more active layers comprising an InP-based material. The active material structure 107, may further include a tunnel junction 112. In various embodiments, the aperture 113 is formed in an confinement layer 111. In various embodiments, light is generated by injecting electrical current through a current confinement aperture defined by the aperture 113 in an confinement layer 111. The optical mode(s) of the VCSEL are confined within the optical confinement aperture. In various embodiments, the aperture 113 in the confinement layer 111 acts as the optical and electrical confinement aperture for the VCSEL 100.

In various examples, the active region 114 comprises a plurality of quantum wells, where light 5 is generated, between the reflectors 104 and 106. In some examples, the active region 114 may comprise multi-quantum well and/or dots layers (MQLs) of VCSEL gain media. For example, the MQLs may comprise a stack or a series of quantum wells disposed between a series of (quantum) barriers. In various embodiments, the MQLs are configured to generate light having a wavelength in the 910-2000 nm wavelength range. In various embodiments, the MQLs are configured to generate light having a wavelength in the 1200-2000 nm wavelength range. In various embodiments, the MQLs are formed from GaAs or InP-based semiconductor materials.

In various embodiments, the active material structure 107 comprises a p-type region (layer) disposed between the second current spreading layer 108 and the MQL stacks outside the tunnel junction, and a tunnel junction 112 disposed on the p-type region (layer). In various embodiments, the tunnel junction 112 comprises one or more tunnel junction sublayers. For example, the tunnel junction 112 may comprise a p++ tunnel junction sublayer and an n++ tunnel junction sublayer.

In various embodiments, a tunnel junction 112 is formed from a layer that extends across the active material structure 107. For example, a tunnel junction form 412 (see FIG. 4A) is formed by epitaxially growing one or more layers of semiconductor material and/or re-growing and/or overgrowing the one or more layers. In an example embodiment, the tunnel junction 112 is formed by performing a re-growing and/or overgrowing process of the tunnel junction form 412 that causes the tunnel junction 112 to include a p++ tunnel junction sublayer and an n++ tunnel junction sublayer.

In various embodiments, the VCSEL 100 comprises an confinement layer 111 configured to provide lateral electrical and/or optical confinement. The confinement layer is formed, in various embodiments, by oxidizing a to-be oxidized layer 482 (See FIG. 4B) to form a confinement layer form 411 (see FIG. 4C) that defines an aperture 113. In an example embodiment, the confinement layer 111 has and/or defines an aperture 113 therein and/or therethrough that acts as the current confinement aperture and the optical confinement aperture. For example, a portion of the to-be-oxidized layer may not be oxidized such that a non-oxidized portion of the confinement layer provides and/or defines an aperture 113 through enabling electrical and/or optical flux therethrough. In various embodiments, the aperture 113 defines the emission aperture of the VCSEL 100. In various embodiments, the confinement layer comprises an aluminum containing compound. For example, in an example embodiment, the confinement layer comprises InAlGaAs and/or InAlAs (e.g., p-type doped InAlGaAs and/or InAlAs) and oxidized InAlGaAs and/or InAlAs.

Figure 2A:
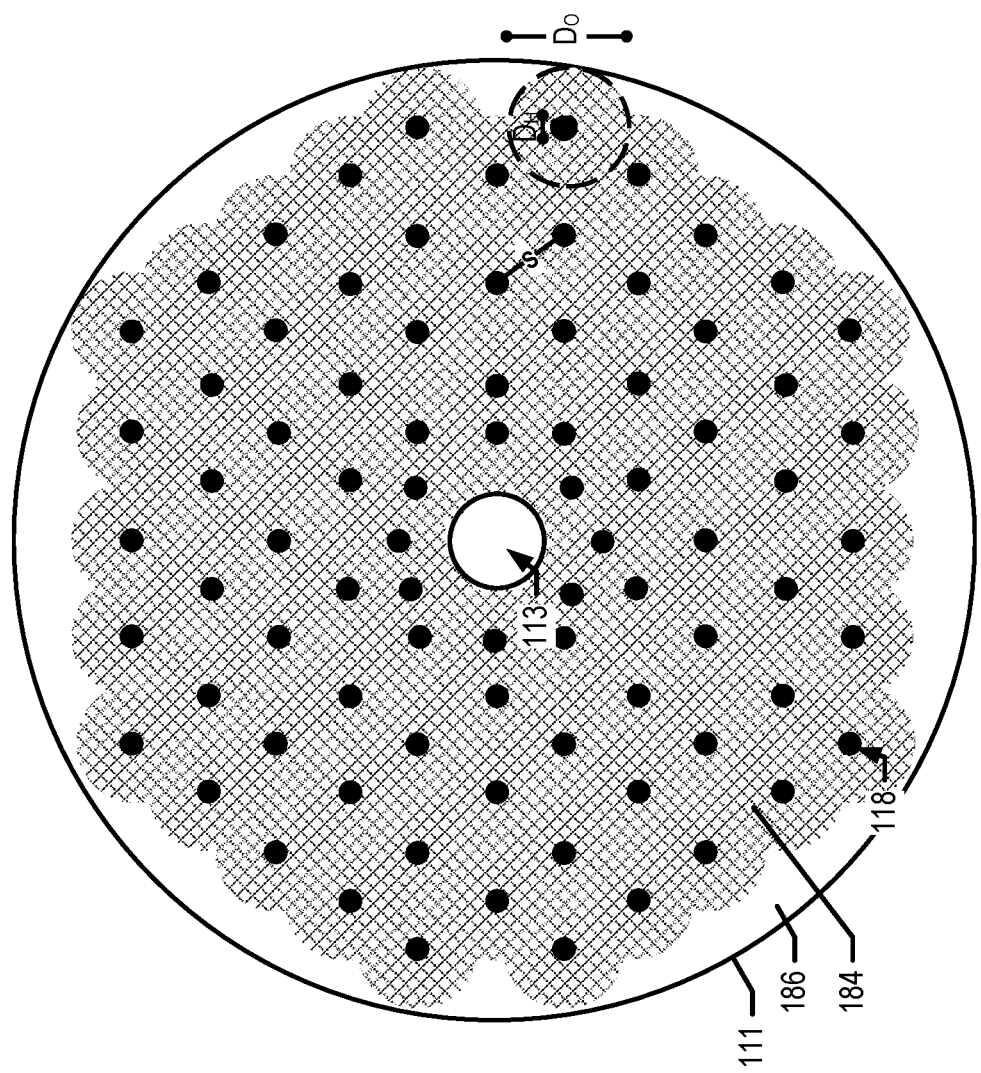
FIG. 2A illustrates a schematic cross-sectional view of a VCSEL taken in a plane substantially perpendicular to the emission axis of the VCSEL along the AA-line shown in FIG. 1, in accordance with an embodiment.

FIG. 2A illustrates a cross-section of the VCSEL 100 taken along the AA line shown in FIG. 1 (e.g., in a plane that is substantially perpendicular to the emission axis 101). As can be seen in FIG. 2A, the confinement layer 111 comprises an oxidized portion 184 and non-oxidized portions 186. The non-oxidized portions 186 comprise the aperture 113 and peripheral portions of the confinement layer 111. In various embodiments, the oxidized portion 184 is continuous such that there is one contiguous oxidized portion 184. In an example embodiment, the oxidized portion 184 comprises oxidized InAlGaAs and/or InAlAs (e.g., InAlGaAs oxide and/or InAlAs oxide) and the non-oxidized portions 186 comprise InAlGaAs and/or InAlAs. In another example embodiment, the oxidized portion 184 comprises oxidized AlGaAs (e.g., AlGaAs oxide) and the non-oxidized portions 186 comprise AlGaAs. In various embodiments, the to-be-oxidized layer comprises an aluminum-containing compound.

In various embodiments, the confinement layer 111 is formed by oxidizing a to-be-oxidized layer through a pattern of holes 185 (see FIG. 4B). For example, the VCSEL 100 comprises a patterned layer 188 comprising a plurality of holes 118 formed therethrough that form the pattern of holes 185. For example, each of the holes 118 of the pattern of holes 185 extends in a direction that is transverse to a plane defined by a first surface of the patterned layer 188, a second surface of the patterned layer 188, and/or a surface of the substrate 105. For example, in an example embodiment, the holes 118 extend in a direction that is substantially parallel to the emission axis 101. In various embodiments, each of the holes 118 of the pattern of holes extends from the first surface of the patterned layer 188 to the second surface of the patterned layer 188 and/or at least to a first surface of the confinement layer 111. In an example embodiment, the pattern of holes 185 is formed and/or etched through the second current spreading layer 108. For example, the patterned layer 188 is the second current spreading layer 108, in an example embodiment. In various embodiments, a to-be-oxidized layer 482 is oxidized through the pattern of holes 185 to form the confinement layer 111. In an example embodiment, the patterned layer 188 comprises p-type InP.

In various embodiments, the pattern of holes 185 comprises a plurality of holes. In an example embodiment, each of the holes has a diameter $D_H$. In various embodiments, the hole diameter $D_H$ is in a range of 0.5 to 5 microns. In various embodiments, the holes of the pattern of holes 185 have various diameters in the range of 0.5 to 5 microns. In various embodiments, the portion of the confinement layer 111 that is oxidized through a particular hole 118 has a diameter $D_O$. In an example embodiment, the oxidation diameter $D_O$ is up to 10 microns. For example, the oxidation of the confinement layer 111 that occurs through the hole 118 has a lateral spread (e.g., a spread in a lateral direction from the hole 118) of up to 10 microns. In an example embodiment, the oxidation diameter $D_O$ is up to four microns. In various embodiments, the pattern of holes has a largest nearest neighbor distance s of 10 microns. In an example embodiment, the nearest neighbor of a first hole 118 is a second hole 118 that is closest to the first hole and the nearest neighbor distance for the first hole is the distance between the first hole and the second hole. For example, the largest nearest neighbor distance s is configured such that the oxidized portion 184 is contiguous.

In various embodiments, the pattern of holes 185 is generally honeycomb and/or hexagonal. For example, in general, a hole has six equally spaced nearest neighbors. In various embodiments, the pattern of holes is not regular around the aperture 113. For example, the pattern of holes 185 is configured such that the oxidized portion 184 defines an aperture 113 of a particular shape, size, and location. For example, the pattern of holes 185 defines the shape, size, and location of the aperture 113.

The example embodiment of the VCSEL 100 illustrated in FIGS. 1 and 2A is a single aperture VCSEL configuration. In particular, the VCSEL 100 illustrated in FIGS. 1 and 2A comprises one aperture 113 defined by the pattern of holes 185. In various embodiments, the VCSEL 100 comprises more than one aperture. FIG. 2B is similar to FIG. 2A, but illustrates a cross-section taken in a plane substantially perpendicular to the emission axis 101 of an example VCSEL having a multi-aperture VCSEL configuration. In particular, the VCSEL illustrated in FIG. 2B comprises multiple apertures 113 (e.g., 113A, 113B, 113C, 113D). In various embodiments, the confinement layer 111 may comprise and/or define two or more apertures. In an example embodiment, the confinement layer 111 comprises and/or defines no more than ten apertures. For example, a single active material structure 107 may be used to generate an array of VCSELs. The pattern of holes 185 defines the location, size, and shape of each of the apertures 113.

In various embodiments, the shape of the aperture(s) 113 is defined by the pattern of holes 185. In various embodiments, the aperture(s) 113 are round, elliptical with various eccentricity values, and/or the like. In various embodiments, a shape of the aperture 113 defines an optical beam profile and/or polarization of light 5 emitted by the VCSEL 100 through the aperture 113. For example, various embodiments enable the fabrication of an array of VCSELs where each VCSEL of the array emits light of a different polarization, enabling polarization-division multiplexing (PDM).

As shown in FIG. 1, in various embodiments, the active material structure 107 further comprises first and second current spreading layers 110, 108. For example, the first and second current spreading layers may act as global contacts providing voltage and/or current to the active material structure 107. In an example embodiment, the first and/or second current spreading layer 110, 108 may comprise a contact layer 116. In various embodiments, the contact layer 116 may be a thin metal layer (e.g., a thin metal ring) configured to distribute current across a corresponding one of the first and/or second current spreading layer 110, 108. For example, the contact layer 116 may distribute current across the second current spreading layer 108 with less resistance than when the current is distributed across the second current spreading layer 108 by the second current spreading layer 108 alone. In various embodiments, the first and second current spreading layers 110, 108 are configured (possibly with corresponding contact layer(s) 116) to provide electrical bias (e.g., a voltage differential and/or a current) to surfaces of the active region 114 that are substantially perpendicular to the emission axis 101. For example, the first and second current spreading layers 110, 108 may be configured (possibly with corresponding contact layer(s) 116) to establish a voltage differential and/or provide a current between a surface of the active region 114 adjacent and/or abutting the first current spreading layer 110 and a surface of the active region 114 comprising a tunnel junction 112 and adjacent the confinement layer 111.

The current spreading layers 108 and 110 may comprise n-type indium phosphide (n-InP) layers. For example, providing the electrical contact to the active region 114 through the n-type current spreading layers 110, 108 may allow for the first reflector 106 and/or the second reflector 104 to comprise un-doped semiconductor DBR mirrors. In some examples, the manufacturing process of the VCSEL creates a mesa structure as shown by the active region 114, the second current spreading layer 108, and the second reflector 104. The mesa structure may be formed on top of the underlying structures (e.g., first current spreading layer 110, first reflector 106, substrate 105, and/or the like). For example, the manufacturing process may include reactive ion etching (RIE) and chemical etching through the various layers to form a mesa structure.

In various embodiments, the VCSEL 100 further comprises first contacts 120A and second contacts 120B. For example, the first contacts 120A may be in electrical communication with the first current spreading layer 110. The second contacts 120B may be in electrical communication with the second current spreading layer 108. In various embodiments, the first contacts 120A and the second contacts 120B are configured to secure the VCSEL 100 into electrical communication with an external power and/or voltage source (e.g., a VCSEL driver and/or the like).

In various embodiments, the VCSEL 100 is configured to transmit optical modulated data bit traffic through optical fibers and/or waveguides with a modulation speed of up to 50 gigabits per second (Gb/s) or faster. In various embodiments, the VCSEL 100 may emit light 5 having a wavelength in the 910-2000 nm wavelength range. In various embodiments, the VCSEL 100 may emit light 5 having a wavelength in the 1200-2000 nm wavelength range.

Example Method of Fabricating a First Example VCSEL

FIG. 3 provides a flowchart illustrating various processes, procedures, operations, and/or the like for fabricating a semiconductor comprising an oxidized confinement layer. For example, the method shown by FIG. 3 may be used to fabricate various embodiments of VCSELs, such as VCSELs 100 illustrated in FIG. 1. FIG. 4A-4C show various stages of fabricating a VCSEL 100.

Starting at step/operation 302, two or more layers of a semiconductor device are formed on a substrate. The two or more layers comprise an exposed layer 480 and a to-be-oxidized layer 482. The to-be-oxidized layer 482 is disposed between the substrate 105 and the exposed layer 480.

For example, as shown in FIG. 4A, one or more layers of a VCSEL blank 400 are formed on a substrate 105. For example, a first reflector form 406 is formed, fabricated, and/or grown on the substrate 105. Additionally, one or more layers are epitaxially grown on the first reflector form 406, such as a first current spreading layer form 410, an active region form 414, a tunnel junction form 412, a to-be-oxidized layer 482, and a second current spreading layer form 408. In various embodiments, the to-be-oxidized layer 482 is a spacer layer and/or a portion of the second current spreading layer 108. In an example embodiment, the to-be-oxidized layer 482 comprises InAlGaAs and/or InAlAs (e.g., p-type doped InAlGaAs and/or InAlAs). In an example embodiment, the second current spreading layer form 408 comprises InP (e.g., p-type doped InP). In various embodiments, the second current spreading layer form 408 is an exposed layer 480.

For example, the first reflector form 406 is formed such that a second surface of the first reflector form 406 is formed on a first surface of the substrate 105. The first current spreading layer form 410 is formed such that a second surface of the first current spreading layer form 410 is formed on a first surface of the first reflector form 406. The active region form 414 is formed such that a second surface of the active region form 414 is formed on a first surface of the first current spreading layer form 410. The tunnel junction form 412 is formed such that a second surface of the tunnel junction form 412 is formed on a first surface of the first current spreading layer form 410. A to-be-oxidized layer 411 is formed such that a second surface of the to-be-oxidized layer 411 is formed on a first surface of the tunnel junction form 412. A second current spreading layer form 408 is formed such that a second surface of the second current spreading layer form 408 is formed on a first surface of the to-be-oxidized layer 411. At this point, no layers are formed on the first surface of the second current spreading layer form 408 such that the first surface of the second current spreading layer form 408 is exposed to the surrounding environment. Thus, the second current spreading layer form 408 is the exposed layer 480.

Thus, in the example embodiment shown in FIG. 4A, the two or more layers of the semiconductor device (e.g., VCSEL 100) formed on the substrate as part of step/operation 302 are the first reflector form 406, the first current spreading layer form 410, the active region form 414, the tunnel junction form 412, the to-be-oxidized layer 411 and the second current spreading layer form 408, which is the exposed layer 480.

Continuing with FIG. 3, at step/operation 304, a pattern of holes is etched through the exposed layer 480 to form a patterned layer. For example, a masking process (e.g., photographic masking) is used to define and etch the pattern of holes, in an example embodiment. In various embodiments, each hole 118 is etched from a first surface of the exposed layer 480 through to at least a second surface of the exposed layer. In an example embodiment, one or more holes 118 of the pattern of holes may be etched at least part way through the to-be-oxidized layer 482. In an example embodiment, the holes 118 are etched completely through the to-be-oxidized layer 482. FIG. 4B illustrates the results of etching the pattern of holes 185 through the exposed layer 480 to form a patterned layer form 488. In various embodiments, the holes 118, are etched through the exposed layer in a direction that is transverse and/or substantially perpendicular to a level plane defined by a surface of the substrate 105. In various embodiments, the level plane is generally and/or substantially parallel to the first surface of the to-be-oxidized layer 482.

As described above, the pattern of holes 185 etched through the exposed layer 480 is generated, selected, and/or the like to define the location, size, and shape of the one or more apertures 113 of the VCSEL 100 Additionally, the pattern of holes 185 etched through the exposed layer 480 is generated, selected, and/or the like to enable complete oxidation of the oxidized portion 184 of the confinement layer formed by oxidizing the to-be-oxidized layer 482. The oxidized portion 184 consists of the parts of the confinement layer 111 that are not part of the one or more apertures 113, possibly with the exclusion of a portion of the periphery of the confinement layer 111, as shown in FIGS. 2A and 2B. Thus, in various embodiments, the nearest neighbor spacing s of the holes 118 are configured such that all of the to-be-oxidized layer 482 between the holes 118 and that is not intended to be part of an aperture 113 can be fully oxidized given the mobility of oxygen in the material of the to-be-oxidized layer. For example, because the mobility of oxygen in InAlGaAs and/or InAlAs is lower than in AlGaAs, in an example embodiment where the to-be-oxidized layer 482 comprises InAlGaAs and/or InAlAs, the nearest neighbor spacing s of the holes 118 may be less than the nearest neighbor spacing s of the holes in an example embodiment where the to-be-oxidized layer comprises AlGaAs. In various embodiments, the nearest neighbor spacing s is no more than 10 microns (e.g., s≤10 µm).

Continuing with FIG. 4, at step/operation 306, the confinement layer 411 is formed by oxidizing the to-be-oxidized layer 482 through the holes 118 of the pattern of holes 185. For example, the substrate 105 (e.g., wafer, etc.) on which the semiconductor is being fabricated may be placed in an oxidation chamber and exposed to an oxidizing gas. In an example embodiment, the oxidizing gas comprises water vapor. In various embodiments, the semiconductor being formed on the substrate 105 is exposed to the oxidizing gas at a temperature in the range of 400-500° C. for a defined period of time. In an example embodiment, the defined period of time is in a range of fifteen minutes to three hours. In an example embodiment, the defined period of time is in a range of five to thirty minutes.

FIG. 4C shows the result of step/operation 306 in the fabricating of a VCSEL 100. In particular, the to-be-oxidized layer 482 has been oxidized through the holes 118 of the pattern of holes 185 such that a confinement layer 411 has been formed. The confinement layer 411 defines an aperture 113 configured to provide lateral electrical and/or optical confinement during operation of the VCSEL 100. The confinement layer 411 further comprises a continuous oxidized portion 484 that includes the portion of the confinement layer 411 comprising an oxidized material (e.g., oxidized InAlGaAs and/or InAlAs, in an example embodiment). The confinement layer 411 comprises non-oxidized portions 486 (e.g., comprising InAlGaAs and/or InAlAs, in an example embodiment) that include the one or more apertures 113 and possibly a peripheral portion of the confinement layer 411.

Returning to FIG. 3, at step/operation 308, additional processing is performed to complete the fabrication of the semiconductor. For example, to finish fabricating the VCSEL 100 from the fabrication stage shown in FIG. 4C to the complete stage shown in FIG. 1, one or more additional processing steps are performed. For example, the VCSEL blank is etched to define the VCSEL mesa structure comprising the active material structure 107. For example, the etching may be performed to form a first reflector 106 from the first reflector form 406, a first current spreading layer 110 from the first current spreading layer form 410, an active region 114 from the active region form 414, a tunnel junction 112 from the tunnel junction form 412, a confinement layer 111 comprising one or more apertures 113 and an oxidized portion 184 from the confinement layer 411, a second current spreading layer 108 from the second current spreading layer form 408 (e.g., a patterned layer 188 from the patterned layer form 488), and/or the like. The contacts 120A, 120B and the contact layer 116 are deposited and/or patterned onto the etched mesa of the active material structure 107, and a second reflector 104 is formed on the patterned layer 188 (e.g., the second current spreading layer 108) and/or the contact layer 116.

A Second Example VCSEL

FIG. 5 illustrates a cross-section of another example embodiment of a VCSEL 500 where the cross-section is taken in a plane comprising the emission axis 501 (e.g., in a plane substantially parallel to the emission axis 501). The second example VCSEL 500 is a VCSEL wherein the second GaAs layer of the second reflector is a patterned layer comprising a pattern of holes through which a first GaAs layer of the second reflector was oxidized to form an electrical and/or optical aperture of the VCSEL. Similar to the VCSEL 100, in various embodiments, the VCSEL 500 is configured to emit light 5 for use in a variety of applications, such as fiber optic data transmission in high-speed fiber optic communication systems. In various embodiments, the VCSEL 500 is configured to emit light having a characteristic wavelength in the 910-2000 nm or in the 1200-2000 nm wavelength range. The VCSEL 500 is formed and/or fabricated on a substrate 505, such as a silicon substrate, a GaAs substrate, and/or other appropriate substrate.

In various scenarios, a plurality of VCSELs 500 may be generated on a large substrate 505 (e.g., a wafer). In an example embodiment, the substrate (e.g., wafer) has at least one dimension (e.g., length, width, or radius) larger than two inches. Once fabrication of one or more VCSELs and/or other electro and/or optical devices are fabricated on the substrate, the substrate (e.g., wafer) may be diced into multiple chips. For example, the VCSELs 500 and/or electro-optical systems formed on the substrate (e.g., wafer) may be separated via a dicing procedure, used as an array of VCSELs, incorporated into an integrated VCSEL system, and/or the like, as appropriate for the application.

The structure of the VCSEL 500 includes an active material structure disposed between two reflectors. For example, FIG. 5 illustrates the active material structure 507 disposed between a first reflector 506 and a second reflector 504. In various embodiments, the active material structure 507 is configured to be operable to generate light of a characteristic wavelength. In various embodiments, the first and second reflector 506, 504 form a cavity therebetween configured to cause the light generated by the active material structure 507 to be emitted as a laser beam and/or laser pulses. For example, the VCSEL 500 may emit light 5 through the second reflector 504 or through the first reflector 506, as appropriate for the application. For example, the VCSEL 500 is configured to be "flip-chip" mounted and emit light through the first reflector 506 and the substrate 505, in an example embodiment. In another embodiment, the VCSEL 500 is configured to emit light 5 through the second reflector 504, as shown in FIG. 5. In various embodiments where the light is emitted through the first reflector 506 into the substrate 505 or coupled to a silicon waveguide, for example, the emission wavelength of light 5 for the VCSEL 500 is in the range of 1100-2000 nm. As can be seen in FIG. 5 the direction in which light 5 is emitted from the VCSEL 500 defines an emission axis 501 of the VCSEL. In various embodiments, the VCSEL 500 is generally rotationally and/or radially symmetric about the emission axis 501. In various embodiments, the emission direction can be configured towards the first reflector 506 (e.g., in a bottom emitting and/or flip-chip configuration).

In various embodiments, the first reflector 506 and/or the second reflector 504 comprise reflector stacks (e.g., dielectric layer stacks). For example, the first reflector 506 and/or the second reflector 504 may comprise un-doped semiconductor distributed Bragg reflector (DBR) mirrors. For example, the first reflector 506 and/or the second reflector 504 may comprise un-doped alternating layers of aluminum gallium arsenide (AlGaAs) and gallium arsenide (GaAs). In various embodiments, the second reflector 504 may comprise a DBR mirror and the first reflector 506 may comprise a micro-electromechanical systems (MEMS) component. For example, a MEMS component may be fabricated on the substrate 505 to form the first reflector 506. In an example embodiment, the first reflector 506 comprises a MEMS high-contrast grating (HCG). In various embodiments, the first reflector 506 may be a hybrid reflector comprising a combination of MEMS components and reflector stacks, such as DBR mirrors.

In various embodiments, a MEMS HCG comprises a thin element having a grating pattern thereon/therein with the period of the grating pattern being smaller than the characteristic wavelength of the corresponding VCSEL 500. In such embodiments, the grating pattern is formed in a first material and is surrounded by and/or embedded in a second material, where the second material has a lower index of refraction than the first material. In various embodiments in which the first reflector 506 comprises a MEMS component (e.g., a MEMS HCG), the MEMS component may be fabricated with lateral coupling functionality such that it is possible to directly couple the light 5 emitted by the VCSEL in one lateral direction or in both lateral directions. In various embodiments, a lateral direction is a direction that is substantially parallel to a plane defined by a surface of the substrate 505. For example, the MEMS component of the first reflector 506 (e.g., MEMS HCG and/or the like) may be used to optically couple the VCSEL to another optical and/or electro-optical component formed on and/or mounted to the substrate 505.

In various embodiments, the first reflector 506 may be operable to and/or configured to control the shape and/or polarization of the beam and/or pulse of light 5 emitted by the VCSEL 500. In various embodiments, the first reflector 506 may be operable to and/or configured to tune the wavelength of light emitted by the VCSEL 500.

In various embodiments, the VCSEL 500 comprises a confinement layer 511 configured to provide lateral electrical and/or optical confinement. In the example embodiment illustrated in FIG. 5, the confinement layer 511 is a layer of the second reflector 504. For example, the second reflector 504 comprises un-doped alternating AlGaAs layers 544 and GaAs layers 542. In an example embodiment, the confinement layer 511 is a partially oxidized AlGaAs layer 544 and the patterned layer 588 comprising the pattern of holes 585 (see FIG. 6B) is an GaAs layer 542 that is directly adjacent to the confinement layer 511. For example, the patterned layer 588 comprising the pattern of holes 585 is the second GaAs layer 542B. The confinement layer 511 is formed, in various embodiments, by oxidizing a to-be oxidized layer 682 (e.g., the AlGaAs layer 544 closest to the bonded interface between the GaAs-based material and the InP-based material and/or closest to the active material structure 507) to form a confinement layer 511 (see FIGS. 6A and 6C) that defines an aperture 513. In an example embodiment, the confinement layer 511 has and/or defines an aperture 513 therein and/or therethrough that acts as the current confinement aperture and the optical confinement aperture. For example, a portion of the to-be-oxidized layer may not be oxidized such that a non-oxidized portion of the confinement layer 511 provides and/or defines an aperture 513 through enabling electrical and/or optical flux therethrough. In various embodiments, the aperture 513 defines the emission aperture of the VCSEL 500.

Similar to the confinement layer 111 illustrated in FIG. 2A or 2B, the confinement layer 511 comprises an oxidized portion and non-oxidized portions. The non-oxidized portions comprise the aperture 513 and possibly peripheral portions of the confinement layer 511. In various embodiments, the oxidized portion is continuous such that there is one contiguous oxidized portion. In an example embodiment, the oxidized portion comprises oxidized AlGaAs (e.g., AlGaAs oxide) and the non-oxidized portions comprise AlGaAs.

In various embodiments, the confinement layer 511 is formed by oxidizing a to-be-oxidized layer through a pattern of holes 585. For example, the VCSEL 500 comprises a patterned layer 588 comprising a plurality of holes 518 formed therethrough. For example, each of the holes 518 of the pattern of holes 585 extends in a direction that is transverse to a plane defined by a first surface of the patterned layer 588, a second surface of the patterned layer 588, and/or a surface of the substrate 505. For example, in an example embodiment, the holes 518 extend in a direction that is substantially parallel to the emission axis 501. In various embodiments, each of the holes of the pattern of holes 585 extends from the first surface of the patterned layer 588 to the second surface of the patterned layer 588 and/or at least to a first surface of the confinement layer 511. In an example embodiment, the pattern of holes 585 is formed and/or etched through the GaAs layer shown as the exposed layer 680 in FIG. 6A. For example, the patterned layer 588 is a layer of the second reflector 504, in an example embodiment. In various embodiments, the to-beoxidized layer 682 is an AlGaAs layer 544 of the second reflector 504. In various embodiments, a to-be-oxidized layer 682 is oxidized through the pattern of holes 585 to form the confinement layer 511.

In various embodiments, the pattern of holes 585 comprises a plurality of holes. In an example embodiment, each of the holes has a diameter $D_H$. In various embodiments, the hole diameter $D_H$ is in a range of 0.5 to 5 microns. In various embodiments, the holes of the pattern of holes 585 have various diameters in the range of 0.5 to 5 microns. In various embodiments, the portion of the confinement layer 511 that is oxidized through a particular hole has a diameter $D_O$. In an example embodiment, the oxidation diameter $D_O$ is up to 10 microns. For example, the oxidation of the confinement layer 511 that occurs through the hole has a lateral spread (e.g., a spread in a lateral direction from the hole) of up to 10 microns. In an example embodiment, the oxidation diameter $D_O$ is up to four microns. In various embodiments, the pattern of holes 585 has a largest nearest neighbor distance s of 10 microns. In an example embodiment, the nearest neighbor of a first hole is a second hole that is closest to the first hole and the nearest neighbor distance for the first hole is the distance between the first hole and the second hole. For example, the largest nearest neighbor distance s is configured such that the oxidized portion is contiguous.

In various embodiments, the pattern of holes 585 is generally honeycomb and/or hexagonal. For example, in general, a hole has six equally spaced nearest neighbors. In various embodiments, the pattern of holes 585 is not regular around the aperture 513. For example, the pattern of holes 585 is configured such that the oxidized portion 584 defines an aperture 513 of a particular shape, size, and location. For example, the pattern of holes 585 defines the shape, size, and location of the aperture 513.

In various embodiments, the confinement layer 511 comprises one aperture 513 defined by the pattern of holes 585. In various embodiments, the VCSEL 500 comprises more than one aperture. In various embodiments, the confinement layer 511 comprises and/or defines two or more apertures. In an example embodiment, the confinement layer 511 comprises and/or defines no more than ten apertures. For example, a single active material structure 507 may be used to generate an array of VCSELs. The pattern of holes 585 defines the location, size, and shape of each of the apertures 513.

In various embodiments, the shape of the aperture(s) 513 is defined by the pattern of holes 585. In various embodiments, the aperture(s) 513 are round, elliptical with various eccentricity values, and/or the like. In various embodiments, a shape of the aperture 513 defines an optical beam profile and/or polarization of light 5 emitted by the VCSEL 500 through the aperture 513. For example, various embodiments enable the fabrication of an array of VCSELs where each VCSEL of the array emits light of a different polarization, enabling PDM.

As shown in FIG. 5, the active material structure 507 is sandwiched between the first and second reflectors 506, 504 and comprises an active region 514. In various embodiments, the active region 514 comprises a stack of quantum well and/or quantum dot layers. The active material structure 507, may further include a tunnel junction 512. In various embodiments, the aperture 513 is formed in a confinement layer 511. In various embodiments, light is generated by injecting electrical current through a current confinement aperture defined by the aperture 513 in a confinement layer 511. The optical mode(s) of the VCSEL are confined within the optical confinement aperture. In various embodiments, the aperture 513 in the confinement layer 511 acts as the optical and electrical confinement aperture for the VCSEL 500.

In various examples, the active region 514 comprises a plurality of quantum wells, where light 5 is generated, between the reflectors 504 and 506. In some examples, the active region 514 may comprise multi-quantum well and/or dots layers (MQLs) of VCSEL gain media. For example, the MQLs may comprise a stack or a series of quantum wells disposed between a series of (quantum) barriers. In various embodiments, the MQLs are configured to generate light having a wavelength in the 910-2000 nm wavelength range. In various embodiments, the MQLs are configured to generate light having a wavelength in the 1200-2000 nm wavelength range. In various embodiments, the MQLs are formed from GaAs or InP-based semiconductor materials.

In various embodiments, the active material structure 507 comprises a p-type region (layer) disposed between the second current spreading layer 508 and the MQL stacks outside the tunnel junction, and a tunnel junction 512 disposed on the p-type region (layer). In various embodiments, the tunnel junction 512 comprises one or more tunnel junction sublayers. For example, the tunnel junction 512 may comprise a p++ tunnel junction sublayer and an n++ tunnel junction sublayer.

In various embodiments, a tunnel junction 512 is formed from a layer that extends across the active material structure 507. For example, a tunnel junction is formed by epitaxially growing one or more layers of semiconductor material and re-growing and/or overgrowing the one or more layers. The re-growing and/or overgrowing process may cause the tunnel junction form to include a p++ tunnel junction sublayer and an n++ tunnel junction sublayer.

In various embodiments, the active material structure 507 further comprises first and second current spreading layers 510, 508. For example, the first and second current spreading layers may act as global contacts providing voltage and/or current to the active material structure 507. In an example embodiment, the first and/or second current spreading layer 510, 508 may comprise a contact layer 516. In various embodiments, the contact layer 516 may be a thin metal layer (e.g., a thin metal ring) configured to distribute current across a corresponding one of the first and/or second current spreading layer 510, 508. For example, the contact layer 516 may distribute current across the second current spreading layer 508 with less resistance than when the current is distributed across the second current spreading layer 508 by the second current spreading layer 508 alone. In various embodiments, the first and second current spreading layers 510, 508 are configured (possibly with corresponding contact layer(s) 516) to provide electrical bias (e.g., a voltage differential and/or a current) to surfaces of the active region 514 that are substantially perpendicular to the emission axis 501. For example, the first and second current spreading layers 510, 508 may be configured (possibly with corresponding contact layer(s) 516) to establish a voltage differential and/or provide a current between a surface of the active region 514 adjacent and/or abutting the first current spreading layer 510 and a surface of the active region 514 comprising a tunnel junction 512.

The current spreading layers 508 and 510 may comprise n-type indium phosphide (n-InP) layers. For example, providing the electrical contact to the active region 514 through the n-type current spreading layers 510, 508 may allow for the first reflector 506 and/or the second reflector 504 to comprise un-doped semiconductor DBR mirrors. In some examples, the manufacturing process of the VCSEL creates a mesa structure as shown by the active region 514, the second current spreading layer 508, and the second reflector 504. The mesa structure may be formed on top of the underlying structures (e.g., first current spreading layer 510, first reflector 506, substrate 505, and/or the like). For example, the manufacturing process may include reactive ion etching (RIE) and chemical etching through the various layers to form a mesa structure.

In various embodiments, the VCSEL 500 further comprises first contacts 520A and second contacts 520B. For example, the first contacts 520A may be in electrical communication with the first current spreading layer 510. The second contacts 520B may be in electrical communication with the second current spreading layer 508. In various embodiments, the first contacts 520A and the second contacts 520B are configured to secure the VCSEL 500 into electrical communication with an external power and/or voltage source (e.g., a VCSEL driver and/or the like).

In various embodiments, the VCSEL 500 is configured to transmit optical modulated data bit traffic through optical fibers and/or waveguides with a modulation speed of up to 50 gigabits per second (Gb/s) or faster. In various embodiments, the VCSEL 500 may emit light 5 having a wavelength in the 910-2000 nm wavelength range. In various embodiments, the VCSEL 500 may emit light 5 having a wavelength in the 1200-2000 nm wavelength range.

Example Method of Fabricating a Second Example VCSEL

As noted above, FIG. 3 provides a flowchart illustrating various processes, procedures, operations, and/or the like for fabricating a semiconductor comprising an oxide confinement layer. For example, the method shown by FIG. 3 may be used to fabricate various embodiments of VCSELs, such as VCSELs 500 illustrated in FIG. 5. FIGS. 6A-6C show various stages of fabricating a VCSEL 500.

Starting at step/operation 302, two or more layers of a semiconductor device are formed on a substrate. The two or more layers comprise an exposed layer 680 and a to-be-oxidized layer 682. The to-be-oxidized layer 682 is disposed between the substrate 505 and the exposed layer 680.

For example, as shown in FIG. 6A, one or more layers of a VCSEL blank 600 are formed on a substrate 505. For example, a first reflector 506 is formed, fabricated, and/or grown on the substrate 505. Additionally, one or more layers are epitaxially grown and/or formed on the first reflector 506, such as first current spreading layer 510, an active region 514, a tunnel junction 512, a second current spreading layer 508, a contact layer 516, and a first few layers (e.g., 542A, 544, and 542B) of a second reflector. In an example embodiment, the AlGaAs layer 544 is the to-be-oxidized layer 682 and comprises AlGaAs. In various embodiments, the second GaAs layer 542B of the first few layers of the second reflector is an exposed layer 680.

For example, the first reflector 506 is formed such that a second surface of the first reflector 506 is formed on a first surface of the substrate 505. The first current spreading layer 510 is formed such that a second surface of the first current spreading layer 510 is formed on a first surface of the first reflector 506. The active region 514 is formed such that a second surface of the active region 514 is formed on a first surface of the first current spreading layer 510. The tunnel junction 512 is formed such that a second surface of the tunnel junction 512 is formed on a first surface of the first current spreading layer 510. A second current spreading layer 508 is formed such that a second surface of the second current spreading layer 508 is formed on a first surface of the tunnel junction 512. A contact layer 516 is formed and/or deposited such that a second surface of the contact layer 516 is formed on a first surface of the second current spreading layer 508. A first GaAs layer 542A of the second reflector 504 is formed such that a second surface of the first GaAs layer 542A is formed on a first surface of the contact layer 516 and/or the second current spreading layer 508. In an example embodiment, the contact pads 520A, 520B may be deposited and/or patterned when the contact layer 516 is formed. An AlGaAs layer 544 of the second reflector 504 is formed such that a second surface of the AlGaAs layer 544 is formed on a first surface of the first GaAs layer 542A. A second GaAs layer 542B is formed on such that a second surface of the second GaAs layer 542B is formed on a first surface of the AlGaAs layer 544.

In various embodiments, the AlGaAs layer 544 is the to-be-oxidized layer 682 and the second GaAs layer 542B is the exposed layer 680. For example, at this point, no layers are formed on the first surface of the second GaAs layer 542B such that the first surface of the second GaAs layer 542B is exposed to the surrounding environment.

Continuing with FIG. 3, at step/operation 304, a pattern of holes 585 is etched through the exposed layer 680 to form a patterned layer 588, as shown in FIG. 6B. For example, a masking process (e.g., photographic masking) is used to define and etch the pattern of holes 585, in an example embodiment. In various embodiments, each hole 518 of the pattern of holes 585 is etched from a first surface of the exposed layer 680 through to at least a second surface of the exposed layer. In an example embodiment, one or more holes 518 of the pattern of holes 585 may be etched at least part of the way through the to-be-oxidized layer 682. In an example embodiment, the one or more holes 518 are etched completely through the to-be-oxidized layer 682. FIG. 6B illustrates the results of etching the pattern of holes 585 through the exposed layer 680 to form a patterned layer 588. In various embodiments, the holes 518 are etched through the exposed layer 680 in a direction that is transverse and/or substantially perpendicular to a level plane defined by a surface of the substrate 505. In various embodiments, the level plane is generally and/or substantially parallel to the first surface of the to-be-oxidized layer 682.

As described above, the pattern of holes 585 etched through the exposed layer 680 is generated, selected, and/or the like to define the location, size, and shape of the one or more apertures 513 of the VCSEL 500. Additionally, the pattern of holes 585 etched through the exposed layer 680 is generated, selected, and/or the like to enable complete oxidation of the oxidized portion of the confinement layer 511 formed by oxidizing the to-be-oxidized layer 682. The oxidized portion consists of the parts of the confinement layer 511 that are not part of the one or more apertures 513, possibly with the exclusion of a portion of the periphery of the confinement layer 511, similar to as shown in FIGS. 2A and 2B. Thus, in various embodiments, the nearest neighbor spacing s of the holes 518 are configured such that all of the to-be-oxidized layer 682 between the holes 518 and that is not intended to be part of an aperture 513 can be fully oxidized given the mobility of oxygen in the material of the to-be-oxidized layer 682. In various embodiments, the nearest neighbor spacing s is no more than 10 microns (e.g., s≤10 μm).

Continuing with FIG. 3, at step/operation 306, the confinement layer 511 is formed by oxidizing the to-be-oxidized layer 682 through the holes 518 of the pattern of holes 585. For example, the substrate 505 (e.g., wafer, etc.) on which the semiconductor is being fabricated may be placed in an oxidation chamber and exposed to an oxidizing gas. In an example embodiment, the oxidizing gas comprises water vapor. In various embodiments, the semiconductor being formed on the substrate 505 is exposed to the oxidizing gas at a temperature in the range of 400-500° C. for a defined period of time. In an example embodiment, the defined period of time is in a range of fifteen minutes to three hours. In an example embodiment, the defined period of time is in a range of five to thirty minutes.

FIG. 6C shows the result of step/operation 306 in the fabricating of a VCSEL 500. In particular, the to-be-oxidized layer 682 has been oxidized through the holes 518 of the pattern of holes 585 such that a confinement layer 511 has been formed. The confinement layer 511 defines an aperture 513 configured to provide lateral electrical and/or optical confinement during operation of the VCSEL 500. The confinement layer 511 further comprises a contiguous oxidized portion that includes the portion of the confinement layer 511 comprising an oxidized material (e.g., oxidized AlGaAs, in an example embodiment). The confinement layer 511 comprises non-oxidized portions (e.g., comprising AlGaAs, in an example embodiment) that include the one or more apertures 513 and possibly a peripheral portion of the confinement layer 511.

Returning to FIG. 3, at step/operation 308, additional processing is performed to complete the fabrication of the semiconductor. For example, one or more additional processing steps are performed to finish fabricating the VCSEL 500 illustrated in FIG. 5 from the fabrication stage shown in FIG. 6C. For example, one or more (wet and/or dry) etching processes are performed to define the mesa structure of the VCSEL 500. For example, one or more additional layers (e.g., AlGaAs layers 544 and/or GaAs layers 542) of the second reflector 504 are formed and/or fabricated on the patterned layer 588 to complete the formation of the second reflector 504. In an example embodiment, the contact pads 520A, 520B are deposited and/or patterned before or after the forming, fabricating, or bonding of the second reflector 504 onto the patterned layer 588. As should be understood, the additional processing steps required to complete the semiconductor device after the formation of the confinement layer depend on the particular semiconductor device and the position of the confinement layer within the semiconductor device.

A Third Example VCSEL

FIG. 7 illustrates a cross-section of another example embodiment of a VCSEL 700 where the cross-section is taken in a plane comprising the emission axis 701 (e.g., in a plane substantially parallel to the emission axis 701). The third example VCSEL 700 is a VCSEL wherein the first GaAs layer of the second reflector is a patterned layer comprising a pattern of holes through which a first GaAs layer of the second reflector was oxidized to form an electrical and/or optical aperture of the VCSEL. Similar to the VCSELs 100, 500, in various embodiments, the VCSEL 700 is configured to emit light 5 for use in a variety of applications, such as fiber optic data transmission in high-speed fiber optic communication systems. In various embodiments, the VCSEL 700 is configured to emit light having a characteristic wavelength in the 910-2000 nm or in the 1200-2000 nm wavelength range. The VCSEL 700 is formed and/or fabricated on a substrate 705, such as a silicon substrate, a GaAs substrate, and/or other appropriate substrate.

In various scenarios, a plurality of VCSELs 700 may be generated on a large substrate 705 (e.g., a wafer). In an example embodiment, the substrate (e.g., wafer) has at least one dimension (e.g., length, width, or radius) larger than two inches. Once fabrication of one or more VCSELs and/or other electro and/or optical devices are fabricated on the substrate, the substrate (e.g., wafer) may be diced into multiple chips. For example, the VCSELs 700 and/or electro-optical systems formed on the substrate (e.g., wafer) may be separated via a dicing procedure, used as an array of VCSELs, incorporated into an integrated VCSEL system, and/or the like, as appropriate for the application.

The structure of the VCSEL 700 includes an active material structure disposed between two reflectors. For example, FIG. 7 illustrates the active material structure 707 disposed between a first reflector 706 and a second reflector 704. In various embodiments, the active material structure 707 is configured to be operable to generate light of a characteristic wavelength. In various embodiments, the first and second reflector 706, 704 form a cavity therebetween configured to cause the light generated by the active material structure 707 to be emitted as a laser beam and/or laser pulses. For example, the VCSEL 700 may emit light 5 through the second reflector 704 or through the first reflector 706, as appropriate for the application. For example, the VCSEL 700 is configured to be "flip-chip" mounted and emit light through the first reflector 706 and the substrate 705, in an example embodiment. In another embodiment, the VCSEL 700 is configured to emit light 5 through the second reflector 704, as shown in FIG. 7. In various embodiments where the light is emitted through the first reflector 706 into the substrate 705 or coupled to a silicon waveguide, for example, the emission wavelength of light 5 for the VCSEL 700 is in the range of 1100-2000 nm. As can be seen in FIG. 7 the direction in which light 5 is emitted from the VCSEL 700 defines an emission axis 701 of the VCSEL. In various embodiments, the VCSEL 700 is generally rotationally and/or radially symmetric about the emission axis 701. In various embodiments, the emission direction can be configured towards the first reflector 706 (e.g., in a bottom emitting and/or flip-chip configuration).

In various embodiments, the first reflector 706 and/or the second reflector 704 comprise reflector stacks (e.g., dielectric layer stacks). For example, the first reflector 706 and/or the second reflector 704 may comprise un-doped semiconductor distributed Bragg reflector (DBR) mirrors. For example, the first reflector 706 and/or the second reflector 704 may comprise un-doped alternating layers of aluminum gallium arsenide (AlGaAs) and gallium arsenide (GaAs). In various embodiments, the second reflector 704 may comprise a DBR mirror and the first reflector 706 may comprise a micro-electromechanical systems (MEMS) component. For example, a MEMS component may be fabricated on the substrate 705 to form the first reflector 706. In an example embodiment, the first reflector 706 comprises a MEMS high-contrast grating (HCG). In various embodiments, the first reflector 706 may be a hybrid reflector comprising a combination of MEMS components and reflector stacks, such as DBR mirrors.

In various embodiments, a MEMS HCG comprises a thin element having a grating pattern thereon/therein with the period of the grating pattern being smaller than the characteristic wavelength of the corresponding VCSEL 700. In such embodiments, the grating pattern is formed in a first material and is surrounded by and/or embedded in a second material, where the second material has a lower index of refraction than the first material. In various embodiments in which the first reflector 706 comprises a MEMS component (e.g., a MEMS HCG), the MEMS component may be fabricated with lateral coupling functionality such that it is possible to directly couple the light 5 emitted by the VCSEL in one lateral direction or in both lateral directions. In various embodiments, a lateral direction is a direction that is substantially parallel to a plane defined by a surface of the substrate 705. For example, the MEMS component of the first reflector 706 (e.g., MEMS HCG and/or the like) may be used to optically couple the VCSEL to another optical and/or electro-optical component formed on and/or mounted to the substrate 705.

In various embodiments, the first reflector 706 may be operable to and/or configured to control the shape and/or polarization of the beam and/or pulse of light 5 emitted by the VCSEL 700. In various embodiments, the first reflector 706 may be operable to and/or configured to tune the wavelength of light emitted by the VCSEL 700.

In various embodiments, the VCSEL 700 comprises a confinement layer 711 configured to provide lateral electrical and/or optical confinement. In the example embodiment illustrated in FIG. 7, the confinement layer 711 is a layer of the second reflector 704. For example, the second reflector 704 comprises un-doped alternating AlGaAs layers 744 and GaAs layers 742. In an example embodiment, the confinement layer 711 is a partially oxidized AlGaAs layer 744 and the patterned layer 788 comprising the pattern of holes 785 (see FIG. 8B) in the first GaAs layer 742A. The confinement layer 711 is formed, in various embodiments, by oxidizing a to-be oxidized layer 882 (e.g., one of the AlGaAs layer 744) to form a confinement layer 711 (see FIGS. 8A and 8C) that defines an aperture 713. In an example embodiment, the confinement layer 711 has and/or defines an aperture 713 therein and/or therethrough that acts as the current confinement aperture and the optical confinement aperture. For example, a portion of the to-be-oxidized layer may not be oxidized such that a non-oxidized portion of the confinement layer 711 provides and/or defines an aperture 713 through enabling electrical and/or optical flux therethrough. In various embodiments, the aperture 713 defines the emission aperture of the VCSEL 700.

Similar to the confinement layer 111 illustrated in FIG. 2A or 2B, the confinement layer 711 comprises an oxidized portion and non-oxidized portions. The non-oxidized portions comprise the aperture 713 and possibly peripheral portions of the confinement layer 711. In various embodiments, the oxidized portion is continuous such that there is one contiguous oxidized portion. In an example embodiment, the oxidized portion comprises oxidized AlGaAs (e.g., AlGaAs oxide) and the non-oxidized portions comprise AlGaAs.

In various embodiments, the confinement layer 711 is formed by oxidizing a to-be-oxidized layer through a pattern of holes 785. For example, the VCSEL 700 comprises a patterned layer 788 comprising a plurality of holes 718 formed therethrough. For example, each of the holes 718 of the pattern of holes 785 extends in a direction that is transverse to a plane defined by a first surface of the patterned layer 788, a second surface of the patterned layer 788, and/or a surface of the substrate 705. For example, in an example embodiment, the holes 718 extend in a direction that is substantially parallel to the emission axis 701. In various embodiments, each of the holes of the pattern of holes 785 extends from the first surface of the patterned layer 788 to the second surface of the patterned layer 788 and/or at least to a first surface of the confinement layer 711. In an example embodiment, the pattern of holes 785 is formed and/or etched through the first GaAs layer 742A. For example, the patterned layer 788 is a layer of the second reflector 704 that is fused to the second current spreading layer 708 of the active material structure 707, in an example embodiment. In various embodiments, the to-be-oxidized layer 882 is an AlGaAs layer 744 of the second reflector 704. In various embodiments, a to-be-oxidized layer 882 is oxidized through the pattern of holes 785 to form the confinement layer 711.

In various embodiments, the pattern of holes 785 comprises a plurality of holes. In an example embodiment, each of the holes has a diameter $D_H$. In various embodiments, the hole diameter $D_H$ is in a range of 0.5 to 5 microns. In various embodiments, the holes of the pattern of holes 785 have various diameters in the range of 0.5 to 5 microns. In various embodiments, the portion of the confinement layer 711 that is oxidized through a particular hole 718 has a diameter $D_O$. In an example embodiment, the oxidation diameter $D_O$ is up to 10 microns. For example, the oxidation of the confinement layer 711 that occurs through the hole has a lateral spread (e.g., a spread in a lateral direction from the hole) of up to 10 microns. In an example embodiment, the oxidation diameter $D_O$ is up to four microns. In various embodiments, the pattern of holes 785 has a largest nearest neighbor distance s of 10 microns. In an example embodiment, the nearest neighbor of a first hole is a second hole that is closest to the first hole and the nearest neighbor distance for the first hole is the distance between the first hole and the second hole. For example, the largest nearest neighbor distance s is configured such that the oxidized portion is contiguous.

In various embodiments, the pattern of holes 785 is generally honeycomb and/or hexagonal. For example, in general, a hole has six equally spaced nearest neighbors. In various embodiments, the pattern of holes 785 is not regular around the aperture 713. For example, the pattern of holes 785 is configured such that the oxidized portion 784 defines an aperture 713 of a particular shape, size, and location. For example, the pattern of holes 785 defines the shape, size, and location of the aperture 713.

In various embodiments, the confinement layer 711 comprises one aperture 713 defined by the pattern of holes 785. In various embodiments, the VCSEL 700 comprises more than one aperture. In various embodiments, the confinement layer 711 comprises and/or defines two or more apertures. In an example embodiment, the confinement layer 711 comprises and/or defines no more than ten apertures. For example, a single active material structure 707 may be used to generate an array of VCSELs. The pattern of holes 785 defines the location, size, and shape of each of the apertures 713.

In various embodiments, the shape of the aperture(s) 713 is defined by the pattern of holes 785. In various embodiments, the aperture(s) 713 are round, elliptical with various eccentricity values, and/or the like. In various embodiments, a shape of the aperture 713 defines an optical beam profile and/or polarization of light 5 emitted by the VCSEL 700 through the aperture 713. For example, various embodiments enable the fabrication of an array of VCSELs where each VCSEL of the array emits light of a different polarization, enabling PDM.

As shown in FIG. 7, the active material structure 707 is sandwiched between the first and second reflectors 706, 704 and comprises an active region 714. In various embodiments, the active region 714 comprises a stack of quantum well and/or quantum dot layers. The active material structure 707, may further include a tunnel junction 712. In various embodiments, the aperture 713 is formed in a confinement layer 711. In various embodiments, light is generated by injecting electrical current through a current confinement aperture defined by the aperture 713 in a confinement layer 711. The optical mode(s) of the VCSEL are confined within the optical confinement aperture. In various embodiments, the aperture 713 in the confinement layer 711 acts as the optical and electrical confinement aperture for the VCSEL 700.

In various examples, the active region 714 comprises a plurality of quantum wells, where light 5 is generated, between the reflectors 704 and 706. In some examples, the active region 714 may comprise multi-quantum well and/or dots layers (MQLs) of VCSEL gain media. For example, the MQLs may comprise a stack or a series of quantum wells disposed between a series of (quantum) barriers. In various embodiments, the MQLs are configured to generate light having a wavelength in the 910-2000 nm wavelength range. In various embodiments, the MQLs are configured to generate light having a wavelength in the 1200-2000 nm wavelength range. In various embodiments, the MQLs are formed from GaAs or InP-based semiconductor materials.

In various embodiments, the active material structure 707 comprises a p-type region (layer) disposed between the second current spreading layer 708 and the MQL stacks outside the tunnel junction, and a tunnel junction 712 disposed on the p-type region (layer). In various embodiments, the tunnel junction 712 comprises one or more tunnel junction sublayers. For example, the tunnel junction 712 may comprise a p++ tunnel junction sublayer and an n++ tunnel junction sublayer.

In various embodiments, a tunnel junction 712 is formed from a layer that extends across the active material structure 707. For example, a tunnel junction is formed by epitaxially growing one or more layers of semiconductor material and re-growing and/or overgrowing the one or more layers. The re-growing and/or overgrowing process may cause the tunnel junction form to include a p++ tunnel junction sublayer and an n++ tunnel junction sublayer.

In various embodiments, the active material structure 707 further comprises first and second current spreading layers 710, 708. For example, the first and second current spreading layers may act as global contacts providing voltage and/or current to the active material structure 707. In an example embodiment, the first and/or second current spreading layer 710, 708 may comprise one or more layers configured for increasing flexibility of fabrication process (e.g., etch stop layers, bonding layers, layers that improve the quality of the contact pads 720A, 720B, and/or the like). In various embodiments, the first and second current spreading layers 710, 708 are configured to provide electrical bias (e.g., a voltage differential and/or a current) to surfaces of the active region 714 that are substantially perpendicular to the emission axis 701. For example, the first and second current spreading layers 710, 708 may be configured to establish a voltage differential and/or provide a current between a surface of the active region 714 adjacent and/or abutting the first current spreading layer 710 and a surface of the active region 714 comprising a tunnel junction 712.

The current spreading layers 708 and/or 710 may comprise n-type indium phosphide (n-InP) layers. For example, providing the electrical contact to the active region 714 through the n-type current spreading layers 710 may allow for the first reflector 706 to comprise un-doped semiconductor DBR mirrors. In some examples, the manufacturing process of the VCSEL creates a mesa structure as shown by the active region 714, the second current spreading layer 708, and the second reflector 704. The mesa structure may be formed on top of the underlying structures (e.g., first current spreading layer 710, first reflector 706, substrate 705, and/or the like). For example, the manufacturing process may include reactive ion etching (RIE) and chemical etching through the various layers to form a mesa structure.

In various embodiments, the VCSEL 700 further comprises first contacts 720A and second contacts 720B. For example, the first contacts 720A may be in electrical communication with the first current spreading layer 710. The second contacts 720B may be in electrical communication with the second reflector 704 (e.g., such that an electrical bias is provided to the active material structure 707). In various embodiments, the first contacts 720A and the second contacts 720B are configured to secure the VCSEL 700 into electrical communication with an external power and/or voltage source (e.g., a VCSEL driver and/or the like).

In various embodiments, the VCSEL 700 is configured to transmit optical modulated data bit traffic through optical fibers and/or waveguides with a modulation speed of up to 50 gigabits per second (Gb/s) or faster. In various embodiments, the VCSEL 700 may emit light 5 having a wavelength in the 910-2000 nm wavelength range. In various embodiments, the VCSEL 700 may emit light 5 having a wavelength in the 1200-2000 nm wavelength range.

Example Method of Fabricating a Third Example VCSEL

As noted above, FIG. 3 provides a flowchart illustrating various processes, procedures, operations, and/or the like for fabricating a semiconductor comprising an oxide confinement layer. For example, the method shown by FIG. 3 may be used to fabricate various embodiments of VCSELs, such as VCSELs 700 illustrated in FIG. 7. FIGS. 8A-8C show various stages of fabricating a VCSEL 700.

Starting at step/operation 302, two or more layers of a semiconductor device are formed on a substrate. The two or more layers comprise an exposed layer 880 and a to-be-oxidized layer 882. The to-be-oxidized layer 882 is disposed between the substrate 805 and the exposed layer 880.

For example, as shown in FIG. 8A, one or more layers of a VCSEL blank 800 are formed on a substrate 705 and one or more layers of a second reflector 704 are formed on a reflector substrate 805 to form a reflector blank 850. For example, a first reflector 706 is formed, fabricated, and/or grown on the substrate 705. Additionally, one or more layers are epitaxially grown and/or formed on the first reflector 706, such as first current spreading layer 710, an active region 714, a tunnel junction 712, a second current spreading layer 708, and, optionally, the layers for electrical contacts to the first current spreading layer 710 and the second current spreading layer 708 configured for use and/or modification during one or more subsequent bonding processes.

On a separate substrate (e.g., reflector substrate 805), a reflector blank 850 is formed. For example, dielectric layers of the second reflector 704 are formed, grown, and/or the like on the reflector substrate 805. In an example embodiment, the reflector substrate 805 is a GaAs substrate, wafer, and/or the like. For example alternating layers of AlGaAs 744 and GaAs 742 are formed on the reflector substrate 805, in an example embodiment. For example, the second GaAs layer 742B is formed such that the first surface of the second GaAs layer 742B is formed on the second surface of an AlGaAs layer 744. The first AlGaAs layer 744A is formed such that the first surface of the first AlGaAs layer 744A is formed on the second surface of the second GaAs layer 742B. The first GaAs layer 742A is formed such that the first surface of the first GaAs layer 742A such that the first surface of the first GaAs layer 742A is formed on the second surface of the first AlGaAs layer 744A.

In an example embodiment, a first AlGaAs layer 744A disposed between the first GaAs layer 742A and the second GaAs layer 742B is the to-be-oxidized layer 782 and comprises AlGaAs. In various embodiments, the first GaAs layer 742A of the second reflector is an exposed layer 880.

Additionally, a VCSEL blank 800 is formed on a substrate 705. For example, the first reflector 706 is formed such that a second surface of the first reflector 706 is formed on a first surface of the substrate 705. The first current spreading layer 710 is formed such that a second surface of the first current spreading layer 710 is formed on a first surface of the first reflector 706. The active region 714 is formed such that a second surface of the active region 714 is formed on a first surface first current spreading layer 710. The tunnel junction 712 is formed such that a second surface of the tunnel junction 712 is formed on a first surface of the first current spreading layer 710. A second current spreading layer 708 is formed such that a second surface of the second current spreading layer 708 is formed on a first surface of the tunnel junction 712. A contact layer 716 is formed and/or deposited such that a second surface of the contact layer 716 is formed on a first surface of the second current spreading layer 708. In an example embodiment, the contact pads 720A, 720B may be deposited and/or patterned when the contact layer 716 is formed.

In various embodiments, the first AlGaAs layer 744A is the to-be-oxidized layer 882 and the first GaAs layer 742A is the exposed layer 880. For example, there are no layers formed on the second surface of the first GaAs layer 742A such that the second surface of the first GaAs layer 742A is exposed to the surrounding environment. Thus, in the example embodiment shown in FIG. 8A, the two or more layers formed on the substrate 805 as part of step/operation 302 are the alternating layers GaAs layers 742 and AlGaAs 744 of the second reflector 704. The VCSEL blank 800 is also formed.

Continuing with FIG. 3, at step/operation 304, a pattern of holes 785 is etched through the exposed layer 880 to form a patterned layer 788 to form a patterned second reflector blank 851, as shown in FIG. 8B. For example, a masking process (e.g., photographic masking) is used to define and etch the pattern of holes 785, in an example embodiment. In various embodiments, each hole 718 of the pattern of holes 785 is etched from a second surface of the exposed layer 880 through to at least a first surface of the exposed layer. In an example embodiment, one or more holes 718 of the pattern of holes 785 may be etched part way through the to-be-oxidized layer 882. FIG. 8B illustrates a patterned second reflector blank 851 that is the result of etching the pattern of holes 785 through the exposed layer 880 to form a patterned layer 788. In various embodiments, the holes 718 are etched through the exposed layer 880 in a direction that is transverse and/or substantially perpendicular to a level plane defined by a surface of the reflector substrate 805. In various embodiments, the level plane is generally and/or substantially parallel to the first surface of the to-be-oxidized layer 882.

As described above, the pattern of holes 785 etched through the exposed layer 880 is generated, selected, and/or the like to define the location, size, and shape of the one or more apertures 713 of the VCSEL 700. Additionally, the pattern of holes 785 etched through the exposed layer 880 is generated, selected, and/or the like to enable complete oxidation of the oxidized portion of the confinement layer 711 formed by oxidizing the to-be-oxidized layer 882. The oxidized portion consists of the parts of the confinement layer 711 that are not part of the one or more apertures 713, possibly with the exclusion of a portion of the periphery of the confinement layer 711, similar to as shown in FIGS. 2A and 2B. Thus, in various embodiments, the nearest neighbor spacing s of the holes 718 are configured such that all of the to-be-oxidized layer 882 between the holes 718 and that is not intended to be part of an aperture 713 can be fully oxidized given the mobility of oxygen in the material of the to-be-oxidized layer 782. In various embodiments, the nearest neighbor spacing s is no more than 10 microns (e.g., s≤10 µm).

Continuing with FIG. 3, at step/operation 306, an oxidized second reflector blank 852 is formed, as shown in FIG. 8C. The oxidized second reflector blank 852 is formed by oxidizing the to-be-oxidized layer 882 through the holes 718 of the pattern of holes 785 to form a confinement layer 711. For example, the reflector substrate 850 (e.g., wafer, etc.) on which the second reflector 704 is being fabricated may be placed in an oxidation chamber and exposed to an oxidizing gas. In an example embodiment, the oxidizing gas comprises water vapor. In various embodiments, the second reflector 704 being formed on the reflector substrate 805 is exposed to the oxidizing gas at a temperature in the range of 400-500° C. for a defined period of time. In an example embodiment, the defined period of time is in a range of fifteen minutes to three hours. In an example embodiment, the defined period of time is in a range of five to thirty minutes.

FIG. 8C shows the result of step/operation 306 in the fabricating of a VCSEL 700. In particular, the to-be-oxidized layer 882 has been oxidized through the holes 718 of the pattern of holes 785 such that a confinement layer 711 of the oxidized second reflector blank 852 has been formed. The confinement layer 711 defines an aperture 713 configured to provide lateral electrical and/or optical confinement during operation of the VCSEL 700. The confinement layer 711 further comprises a contiguous oxidized portion that includes the portion of the confinement layer 711 comprising an oxidized material (e.g., oxidized AlGaAs, in an example embodiment). The confinement layer 711 comprises non-oxidized portions (e.g., comprising AlGaAs, in an example embodiment) that include the one or more apertures 713 and possibly a peripheral portion of the confinement layer 711.

Returning to FIG. 3, at step/operation 308, additional processing is performed to complete the fabrication of the VCSEL. For example, one or more additional processing steps are performed to finish fabricating the VCSEL 700 illustrated in FIG. 7 from the VCSEL blank 800 and the oxidized second reflector blank 852. For example, the second surface of the first GaAs layer 742A is bonded and/or fused onto the first surface of the VCSEL blank 800 (e.g., the first surface of the contact layer 716 and/or second current spreading layer 708). In an example embodiment, the oxidized second reflector blank 852 is bonded and/or fused to the VCSEL blank 800 to form a low resistivity (e.g., less than $1*10^{-3}$ ohms*cm$^2$) fused interface between the contact layer 716 and/or second current spreading layer 708 and the first GaAs layer 742A of the second reflector 704. Once the oxidized second reflector blank 852 is bonded and/or fused to the VCSEL blank 800, the reflector substrate 805 is removed (e.g., via etching). As should be understood, the additional processing steps required to complete the semiconductor device after the formation of the confinement layer depend on the particular semiconductor device and the position of the confinement layer within the semiconductor device.

A Fourth Example VCSEL

FIG. 9 illustrates a cross-section of an example embodiment of a VCSEL 900 where the cross-section is taken in a plane comprising the emission axis 901 (e.g., in a plane substantially parallel to the emission axis 901). The fourth example VCSEL 900 is a VCSEL comprising two patterned layers, each comprising a respective pattern of holes through which a respective oxidized layer was oxidized to form a composite electrical and/or optical aperture of the VCSEL. Similar to VCSELs 100, 500, and 700, a VCSEL 900 is configured to emit light 5 for use in a variety of applications, such as fiber optic data transmission in high-speed fiber optic communication systems. In various embodiments, the VCSEL 900 is configured to emit light having a characteristic wavelength in 910-2000 nm or in the 1200-2000 nm wavelength range. The VCSEL 900 is formed and/or fabricated on a substrate 905, such as a silicon substrate, a GaAs substrate, and/or other appropriate substrate.

In various embodiments, the VCSEL 900 comprises at least one compound aperture comprising one or more first apertures 913A and one or more second apertures 913B. For example, in various embodiments, the VCSEL 900 comprises a first confinement layer 911A having one or more first apertures 913A formed and/or defined therein and a second confinement layer 911B having one or more second apertures 913B formed and/or defined therein. The ability to include the at least one second aperture 913B provides an additional degree of freedom in the design and fabrication of the VCSEL 900. In various embodiments, the at least one first aperture 913A acts as the primary or dominant current and optical confinement aperture. The at least one second aperture 913B contributes to a reduction in the parasitic capacitance of the VCSEL 900. Both the at least one first aperture 913A and the at least one second aperture 913B contribute to the optical mode confinement and polarization stabilization of light 5 emitted from the VCSEL 900. In an example embodiment, each of the one or more first apertures 913A is aligned (e.g., centered) with a respective one of the one or more second apertures 913B. In an example embodiment, a first aperture 913A is the same size and shape than the respective second aperture 913B that is aligned and/or centered on the first aperture 913A. In an example embodiment, a first aperture 913A is bigger than the respective second aperture 913B. Various size, shape, alignment (or misalignment) relationships may exist between the one or more first apertures 913A and the one or more second apertures 913B, as appropriate for the particular application.

In various scenarios, a plurality of VCSELs 900 may be generated on a large substrate 905 (e.g., a wafer). In an example embodiment, the substrate (e.g., wafer) has at least one dimension (e.g., length, width, or radius) larger than two inches. Once fabrication of one or more VCSELs and/or other electro and/or optical devices are fabricated on the substrate, the substrate (e.g., wafer) may be diced into multiple chips. For example, the VCSELs 900 and/or electro-optical systems formed on the substrate (e.g., wafer) may be separated via a dicing procedure, used as an array of VCSELs, incorporated into an integrated VCSEL system, and/or the like, as appropriate for the application.

The structure of the VCSEL 900 includes an active material structure disposed between two reflectors. For example, FIG. 9 illustrates the active material structure 907 disposed between a first reflector 906 and a second reflector 904. In various embodiments, the active material structure 907 is configured to be operable to generate light of a characteristic wavelength. In various embodiments, the first and second reflector 906, 904 form a cavity therebetween configured to cause the light generated by active material structure 907 to be emitted as a laser beam and/or laser pulses. For example, the VCSEL 900 may be configured to emit light 5 through the second reflector 904 or through the first reflector 906, as appropriate for the application. For example, in an example embodiment, the VCSEL 900 is configured to be "flip-chip" mounted and emit light through the first reflector 906 and the substrate 905. In another embodiment, the VCSEL 900 is configured to emit light 5 through the second reflector 904, as shown in FIG. 1. In various embodiments where the light is emitted through first reflector 906 into the substrate or coupled to a waveguide (e.g., silicon waveguide and/or another waveguide), for example, the emission wavelength of light 5 for the VCSEL 900 is in the range of 1100-2000 nm. As can be seen in FIG. 9, the direction in which light 5 is emitted from the VCSEL 900 defines an emission axis 901 of the VCSEL. In various embodiments, the VCSEL 900 is generally rotationally and/or radially symmetric about the emission axis 901. In various embodiments, the emission direction can be configured towards first reflector 906 (e.g., in a bottom emitting and/or flip-chip configuration).

In various embodiments, the first reflector 906 comprises reflector stacks (e.g., dielectric layer stacks). For example, the first reflector 906 may comprise un-doped semiconductor distributed Bragg reflector (DBR) mirrors. For example, the first reflector 906 may comprise un-doped alternating layers of aluminum gallium arsenide (AlGaAs) and gallium arsenide (GaAs). In various embodiments, the second reflector 904 may comprise a DBR mirror and the first reflector 906 may comprise a micro-electromechanical systems (MEMS) component. For example, a MEMS component may be fabricated on the substrate 905 to form the first reflector 906. In an example embodiment, the first reflector 906 comprises a MEMS high-contrast grating (HCG). In various embodiments, the first reflector 906 may be a hybrid reflector comprising a combination of MEMS components and reflector stacks, such as DBR mirrors.

In various embodiments, a MEMS HCG comprises a thin element having a grating pattern thereon/therein with the period of the grating pattern being smaller than the characteristic wavelength of the corresponding VCSEL 900. In such embodiments, the grating pattern is formed in a first material and is surrounded by and/or embedded in a second material, where the second material has a lower index of refraction than the first material. In various embodiments in which the first reflector 906 comprises a MEMS component (e.g., a MEMS HCG), the MEMS component may be fabricated with lateral coupling functionality such that it is possible to directly couple the light 5 emitted by the VCSEL in one lateral direction or in both lateral directions. In various embodiments, a lateral direction is a direction that is substantially parallel to a plane defined by a surface of the substrate 905. For example, the MEMS component of the first reflector 906 (e.g., MEMS HCG and/or the like) may be used to optically couple the VCSEL to another optical and/or electro-optical component formed on and/or mounted to the substrate 905.

In various embodiments, the first reflector 906 may be operable to and/or configured to control the shape and/or polarization of the beam and/or pulse of light 5 emitted by the VCSEL 900. In various embodiments, the first reflector 906 may be operable to and/or configured to tune the wavelength of light emitted by the VCSEL 900.

In various embodiments, the second reflector 904 comprises un-doped semiconductor distributed Bragg reflector (DBR) mirrors. For example, the second reflector 904 may comprise un-doped alternating layers of aluminum gallium arsenide (AlGaAs) and gallium arsenide (GaAs). In various embodiments, the second reflector 904 does not include an AlGaAs-based DBR. For example, the second reflector 904 may comprise various reflective elements providing a desired level of reflectance for the intended application of the VCSEL at the characteristic wavelength of the VCSEL 900.

The active material structure 907 may be sandwiched between the first and second reflectors 906, 904 and may comprise an active region 914. In various embodiments, the active region 914 comprises a stack of quantum well and/or quantum dot layers (MQLs). In various embodiments, the MQLs are VCSEL gain media. For example, the MQLs may comprise a stack or a series of quantum wells disposed between a series of (quantum) barriers. In various embodiments, the MQLs are configured to generate light having a wavelength in the 910-2000 nm wavelength range. In various embodiments, the MQLs are configured to generate light having a wavelength in the 1200-2000 nm wavelength range. In various embodiments, the MQLs are formed from GaAs or InP-based semiconductor materials.

The active material structure 907, may further include a tunnel junction 912. In various embodiments, a tunnel junction 912 is formed from a layer that extends across the active material structure 907. For example, a tunnel junction form 1112 (see FIG. 11A) is formed by epitaxially growing one or more layers of semiconductor material and/or re-growing and/or overgrowing the one or more layers. In an example embodiment, the tunnel junction 912 is formed by performing a re-growing and/or overgrowing process on the tunnel junction form 1112 that causes the tunnel junction 912 to include a p++ tunnel junction sublayer and an n++ tunnel junction sublayer. For example, in various embodiments, the tunnel junction 912 comprises one or more tunnel junction sublayers. For example, the tunnel junction 912 may comprise a p++ tunnel junction sublayer and an n++ tunnel junction sublayer.

In various embodiments, the active material structure 907 comprises a p-type region (layer) disposed between the second current spreading layer 908 and the MQL stacks of the active region 917. In an example embodiment, the tunnel junction 912 is disposed on the p-type region (layer).

In various embodiments, the VCSEL 900 comprises a composite aperture formed by first aperture 913A and second aperture 913B. As shown in FIG. 9, the VCSEL 900 comprises a first confinement layer 911A and a second confinement layer 911B. The first confinement layer 911A comprises one or more first apertures 913A. The shape, size, and positioning of each of the one or more first apertures 913A is configured, formed, and/or defined by the first pattern of holes comprising a plurality of first holes 918A through a first patterned layer 988A. In the illustrated embodiment, the first confinement layer 911A is an InP-based layer and the first patterned layer 988A is at least a portion of the second current spreading layer 908. The second confinement layer 911B comprises one or more second apertures 913B. The shape, size, and positioning of each of the one or more second apertures 913B is configured, formed, and/or defined by the second pattern of holes comprising a plurality of second holes 918B through a second patterned layer 988B. In the illustrated embodiment, the second confinement layer 911B is a layer of the second reflector 904 and the second patterned layer 988B is another layer of the second reflector 904.

In various embodiments, light is generated by injecting electrical current through a current confinement aperture defined by the apertures 913A, 913B in the respective oxide confinement layers 911A, 911B. The optical mode(s) of the VCSEL are confined within the optical confinement apertures. In various embodiments, the apertures 913A, 913B in the oxide confinement layers 911A, 911B act as the optical and electrical confinement aperture for the VCSEL 900.

For example, in various embodiments, the VCSEL 900 comprises a plurality (e.g., two) oxide confinement layers 911A, 911B configured to provide lateral electrical and/or optical confinement. The oxide confinement layers 911A, 911B are formed, in various embodiments, by oxidizing a respective to-be oxidized layer 1182A, 1182B (see FIGS. 11B and 11E) that defines the respective one or more apertures 913A, 913B. In an example embodiment, a confinement layer 911A, 911B has and/or defines one or more respective apertures 913A, 913B therein and/or therethrough that acts as a current confinement aperture and the optical confinement aperture. For example, a portion of a to-be-oxidized layer 1182A, 1182B may not be oxidized such that a non-oxidized portion of the confinement layer 911A, 911B provides and/or defines an aperture 913A, 913B through enabling electrical and/or optical flux therethrough. In various embodiments, the apertures 913A, 913B collectively define the emission aperture of the VCSEL 900. In various embodiments, the oxide confinement layers 911A, 911B comprise a respective aluminum containing compound. For example, in an example embodiment, the first confinement layer 911A comprises InAlGaAs and/or InAlAs (e.g., p-type doped InAlGaAs and/or InAlAs) and oxidized InAlGaAs and/or InAlAs. In an example embodiment, the second confinement layer 911B comprises AlGaAs and oxidized AlGaAs.

Figure 11A:
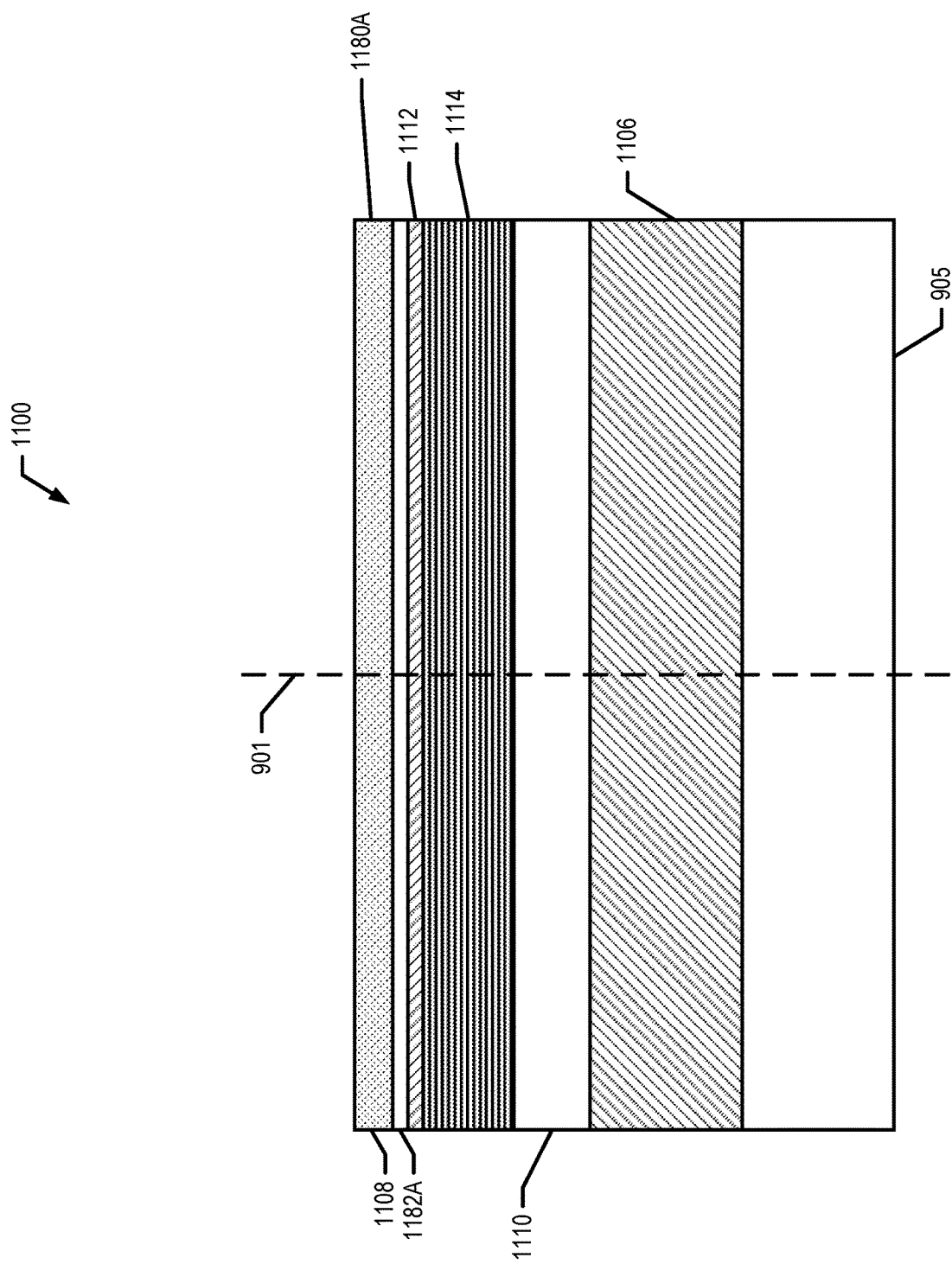
Figure 11B:
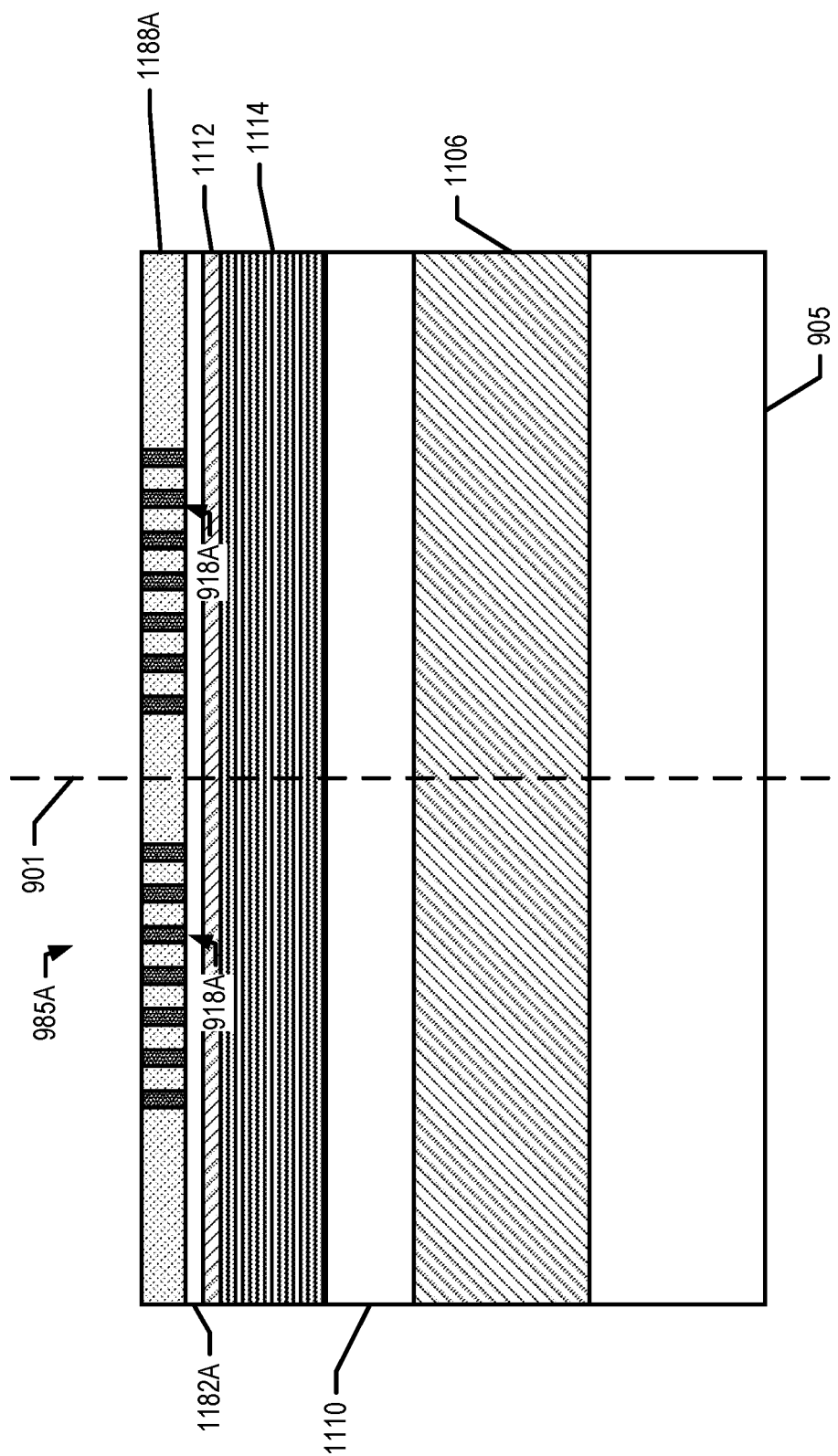
Figure 11C:
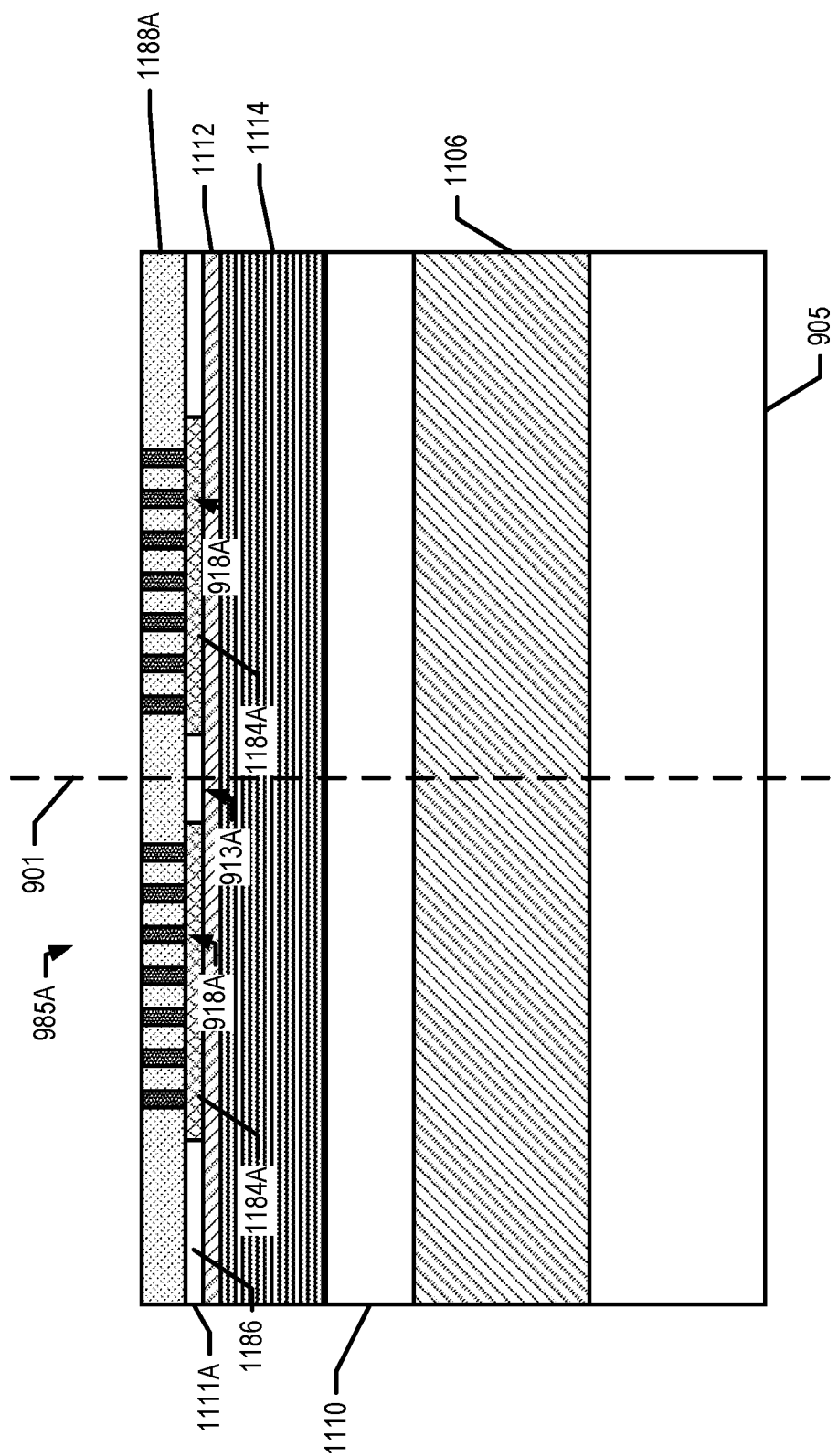
Figure 11D:
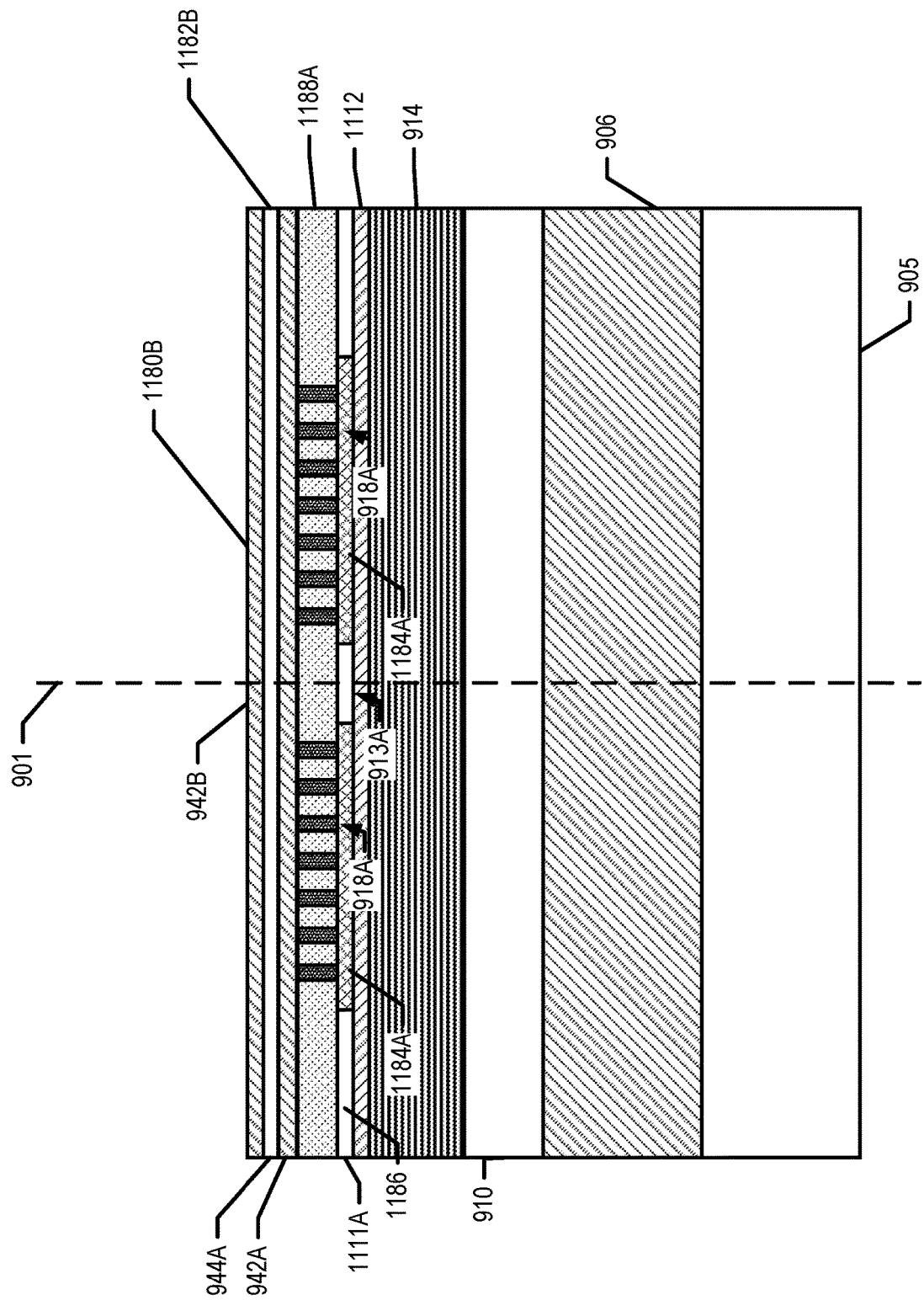

In various embodiments, the oxide confinement layers 911A, 911B is formed by oxidizing a respective to-be-oxidized layer 1182A, 1182B through a respective pattern of holes 985A, 985B (see FIGS. 11B and 11D). For example, the VCSEL 900 comprises a patterned layer 988A, 988B corresponding to a respective one of the oxide confinement layers 911A, 911B. Each patterned layer 988A, 988B comprises a respective plurality of holes 918A, 918B formed therethrough that form the respective pattern of holes 985A, 985B. For example, each of the holes 918A, 918B of the respective pattern of holes 985A, 985B extends in a direction that is transverse to a plane defined by a first surface of the respective patterned layer 988A, 988B, a second surface of the respective patterned layer 988A, 988B, and/or a surface of the substrate 905. For example, in an example embodiment, the holes 918A, 918B extend in a direction that is substantially parallel to the emission axis 901. In various embodiments, each of the holes 918A, 918B of the respective pattern of holes 985A, 985B extends from the first surface of the respective patterned layer 988A, 988B to the second surface of the respective patterned layer 988A, 988B and/or at least to a first surface of the respective confinement layer 911A, 911B.

In an example embodiment, the first pattern of holes 985A is formed and/or etched through the second current spreading layer 908. For example, the first patterned layer 988 is the second current spreading layer 908, in an example embodiment. In various embodiments, a first to-be-oxidized layer 982 is oxidized through the first pattern of holes 985A to form the first confinement layer 911A. In an example embodiment, the first patterned layer 988A comprises p-type InP.

In an example embodiment, the second pattern of holes 985B is formed and/or etched through a layer of the second reflector 904. For example, in an example embodiment, the second pattern of holes 985B is formed and/or etched through the second GaAs layer 942B of the second reflector 904. In various embodiments, the second confinement layer 911B is an AlGaAs layer 944 of the second reflector 904.

In various embodiments, the first and second patterns of holes 985A, 985B comprises a respective plurality of holes 918A, 918B. In an example embodiment, each of the holes has a diameter $D_H$. In various example embodiments, holes of the first plurality of holes 918A may have the same or different diameters than the holes of the second plurality of holes 918B. In various embodiments, the hole diameter $D_H$ is in a range of 0.5 to 5 microns. In various embodiments, the holes of the patterns of holes 985A, 985B have various diameters in the range of 0.5 to 5 microns. In various embodiments, the portion of a respective confinement layer 911A, 911B that is oxidized through a particular hole 918A, 918B has a diameter $D_O$. In an example embodiment, the oxidation diameter $D_O$ is up to 10 microns. For example, the oxidation of the confinement layer 911A, 911B that occurs through the hole 918A, 918B has a lateral spread (e.g., a spread in a lateral direction from the hole 918A, 918B) of up to 10 microns. In an example embodiment, the oxidation diameter $D_O$ is up to four microns. In various embodiments, the pattern of holes 985A 985B has a largest nearest neighbor distance s of 10 microns. In an example embodiment, the nearest neighbor of a first hole 918A, 918B is a second hole 918A, 918B that is closest to the first hole and the nearest neighbor distance for the first hole is the distance between the first hole and the second hole. For example, the largest nearest neighbor distance s is configured such that the oxidized portion 984 is contiguous.

In various embodiments, the patterns of holes 985A, 985B is generally honeycomb and/or hexagonal. For example, in general, a hole has six equally spaced nearest neighbors. In various embodiments, the patterns of holes are not regular around the apertures 913A, 913B. For example, the patterns of holes 985A, 985B are each configured such that the respective oxidized portion 984A, 984B defines a respective aperture 913A, 913B of a particular shape, size, and location. For example, the first pattern of holes 985A defines the shape, size, and location of the first aperture 913A and the second pattern of holes 985B defines the shape, size and location of the second aperture 913B.

As noted above, each pattern of holes 985A, 985B defines a respective one or more apertures 913A, 913B. For example, each confinement layer 911A, 911B comprise and/or defines one or more apertures (e.g., up to ten apertures, in an example embodiment). For example, a single active material structure 907 may be used to generate an array of VCSELs. The patterns of holes 985A, 985B define the location, size, and shape of each respective aperture 913A, 913B.

In various embodiments, the shape of the aperture(s) 913A, 913B is defined by the respective pattern of holes 985A, 985B. For example, the aperture(s) 913A, 913B of a confinement layer 911A, 911B is formed by the oxidation of confinement layer 911A, 911B through the holes 918A, 918B of the respective patterned layer 988A, 988B. In various embodiments, the aperture(s) 913A are round, elliptical with various eccentricity values, and/or the like. In various embodiments, a shape of the aperture 913A, 913B defines an optical beam profile and/or polarization of light 5 emitted by the VCSEL 900 through the composite aperture formed by the first and second apertures 913A, 913B. For example, various embodiments enable the fabrication of an array of VCSELs where each VCSEL of the array emits light of a different polarization, enabling polarization-division multiplexing (PDM).

As shown in FIG. 9, in various embodiments, the active material structure 907 further comprises first and second current spreading layers 910, 908. For example, the first and second current spreading layers may act as global contacts providing voltage and/or current to the active material structure 907. In an example embodiment, the first and/or second current spreading layer 910, 908 may comprise a contact layer. In various embodiments, the contact layer may be a thin metal layer (e.g., a thin metal ring) configured to distribute current across a corresponding one of the first and/or second current spreading layer 910, 908. For example, the contact layer may distribute current across the second current spreading layer 908 with less resistance than when the current is distributed across the second current spreading layer 908 by the second current spreading layer 908 alone. In various embodiments, the first and second current spreading layers 910, 908 are configured (possibly with corresponding contact layer(s)) to provide electrical bias (e.g., a voltage differential and/or a current) to surfaces of the active region 914 that are substantially perpendicular to the emission axis 901. For example, the first and second current spreading layers 910, 908 may be configured (possibly with corresponding contact layer(s)) to establish a voltage differential and/or provide a current between a surface of the active region 914 adjacent and/or abutting the first current spreading layer 910 and a surface of the active region 914 comprising a tunnel junction 912 and adjacent the first confinement layer 911A.

The current spreading layers 908 and 910 may comprise n-type indium phosphide (n-InP) layers. For example, providing the electrical contact to the active region 914 through the n-type current spreading layers 910, 908 may allow for the first reflector 906 and/or the second reflector 904 to comprise un-doped semiconductor DBR mirrors. In some examples, the manufacturing process of the VCSEL creates a mesa structure as shown by the active region 914, the second current spreading layer 908, and the second reflector 904. The mesa structure may be formed on top of the underlying structures (e.g., first current spreading layer 910, first reflector 906, substrate 905, and/or the like). For example, the manufacturing process may include reactive ion etching (RIE) and chemical etching through the various layers to form a mesa structure.

In various embodiments, the VCSEL 900 further comprises first contacts 920A and second contacts 920B. For example, the first contacts 920A may be in electrical communication with the first current spreading layer 910. The second contacts 920B may be in electrical communication with the second current spreading layer 908. In various embodiments, the first contacts 920A and the second contacts 920B are configured to secure the VCSEL 900 into electrical communication with an external power and/or voltage source (e.g., a VCSEL driver and/or the like).

In various embodiments, the VCSEL 900 is configured to transmit optical modulated data bit traffic through optical fibers and/or waveguides with a modulation speed of up to 50 gigabits per second (Gb/s) or faster. In various embodiments, the VCSEL 900 may emit light 5 having a wavelength in the 910-2000 nm wavelength range. In various embodiments, the VCSEL 900 may emit light 5 having a wavelength in the 1200-2000 nm wavelength range.

Example Method of Fabricating a Fourth Example VCSEL

FIG. 10 provides a flowchart illustrating various processes, procedures, operations, and/or the like for fabricating a semiconductor comprising an oxidized confinement layer. For example, the method shown by FIG. 10 may be used to fabricate various embodiments of VCSELs, such as VCSELs 900 illustrated in FIG. 9. FIG. 11A-11F show various stages of fabricating a VCSEL 900.

Starting at step/operation 1002, two or more layers of a semiconductor device are formed on a substrate 905. The two or more layers comprise a first exposed layer 1180A and a first to-be-oxidized layer 1182A. The first to-be-oxidized layer 1182A is disposed between the substrate 905 and the first exposed layer 1180A.

For example, as shown in FIG. 11A, one or more layers of a VCSEL blank 1100 are formed on a substrate 905. For example, a first reflector form 1106 is formed, fabricated, and/or grown on the substrate 905. Additionally, one or more layers are epitaxially grown on the first reflector form 1106, such as a first current spreading layer form 1110, an active region form 1114, a tunnel junction form 1112, a first to-be-oxidized layer 1182A, and a second current spreading layer form 1108. In various embodiments, the first to-be-oxidized layer 1182A is a spacer layer and/or a portion of the second current spreading layer 1108. In an example embodiment, the first to-be-oxidized layer 1182A comprises InAlGaAs and/or InAlAs (e.g., p-type doped InAlGaAs and/or InAlAs). In an example embodiment, the second current spreading layer form 1108 comprises InP (e.g., p-type doped InP). In various embodiments, the second current spreading layer form 1108 is a first exposed layer 1180A.

For example, the first reflector form 1106 is formed such that a second surface of the first reflector form 1106 is formed on a first surface of the substrate 905. The first current spreading layer form 1110 is formed such that a second surface of the first current spreading layer form 1110 is formed on a first surface of the first reflector form 1106. The active region form 1114 is formed such that a second surface of the active region form 1114 is formed on a first surface first current spreading layer form 1110. The tunnel junction form 1112 is formed such that a second surface of the tunnel junction form 1112 is formed on a first surface of the first current spreading layer form 1110. A first to-be-oxidized layer 1182A is formed such that a second surface of the first to-be-oxidized layer 1182A is formed on a first surface of the tunnel junction form 1112. A second current spreading layer form 1108 is formed such that a second surface of the second current spreading layer form 1108 is formed on a first surface of the first to-be-oxidized layer 1182A. At this point, no layers are formed on the first surface of the second current spreading layer form 1108 such that the first surface of the second current spreading layer form 1108 is exposed to the surrounding environment. Thus, the second current spreading layer form 1108 is the first exposed layer 1180A.

Thus, in the example embodiment shown in FIG. 11A, the two or more layers of the semiconductor device (e.g., VCSEL 900) formed on the substrate 905 as part of step/operation 1002 are the first reflector form 1106, the first current spreading layer 1110, the active region form 1114, the tunnel junction form 1112, the first to-be-oxidized layer 1182A, and the second current spreading layer form 1108, which is the first exposed layer 1180A.

Continuing with FIG. 10, at step/operation 1004, a first pattern of holes 985A is etched through the first exposed layer 1180A to form a first patterned layer form 1188A. For example, a masking process (e.g., photographic masking) is used to define and etch the first pattern of holes, in an example embodiment. In various embodiments, each hole 918A of the first pattern of holes 985A is etched from a first surface of the first exposed layer 1180A through to at least a second surface of the first exposed layer. In an example embodiment, one or more holes 918A of the first pattern of holes may be etched part way through the first to-be-oxidized layer 1182A. FIG. 4B illustrates the results of etching the first pattern of holes 985A through the first exposed layer 1180A to form a first patterned layer form 1188A. In various embodiments, the holes 918A, are etched through the first exposed layer 1180A in a direction that is transverse and/or substantially perpendicular to a level plane defined by a surface of the substrate 905. In various embodiments, the level plane is generally and/or substantially parallel to the first surface of the first to-be-oxidized layer 1182A.

As described above, the first pattern of holes 985A etched through the first exposed layer 1180A is generated, selected, and/or the like to define the location, size, and shape of the one or more first apertures 913A of the VCSEL 900 Additionally, the first pattern of holes 985 etched through the first exposed layer 1180A is generated, selected, and/or the like to enable complete oxidation of the oxidized portion 984A of the first confinement layer 911A formed by oxidizing the first to-be-oxidized layer 1182A. The oxidized portion 984A consists of the parts of the first confinement layer 911A that are not part of the one or more first apertures 913A, possibly with the exclusion of a portion of the periphery of the first confinement layer 911A, as shown in FIGS. 2A and 2B. Thus, in various embodiments, the nearest neighbor spacing s of the holes 918A are configured such that all of the first to-be-oxidized layer 1182A between the holes 918A and that is not intended to be part of the first aperture(s) 913 can be fully oxidized given the mobility of oxygen in the material of the first to-be-oxidized layer. For example, because the mobility of oxygen in InAlGaAs and/or InAlAs is lower than in AlGaAs, in an example embodiment where the first to-be-oxidized layer 1182A comprises InAlGaAs and/or InAlAs, the nearest neighbor spacing s of the holes 918A may be less than the nearest neighbor spacing s of the holes in an example embodiment where the to-be-oxidized layer comprises AlGaAs. In various embodiments, the nearest neighbor spacing s is no more than 10 microns (e.g., s≤10 μm).

Continuing with FIG. 10, at step/operation 1006, the first confinement layer form 1111A is formed by oxidizing the first to-be-oxidized layer 1182A through the holes 918A of the first pattern of holes 985A. For example, the substrate 905 (e.g., wafer, etc.) on which the semiconductor is being fabricated may be placed in an oxidation chamber and exposed to an oxidizing gas. In an example embodiment, the oxidizing gas comprises water vapor. In various embodiments, the semiconductor being formed on the substrate 905 is exposed to the oxidizing gas at a temperature in the range of 400-500° C. for a defined period of time. In an example embodiment, the defined period of time is in a range of fifteen minutes to three hours. In an example embodiment, the defined period of time is in a range of five to thirty minutes.

FIG. 11C shows the result of step/operation 1006 in the fabricating of a VCSEL 900. In particular, the first to-be-oxidized layer 1182A has been oxidized through the holes 918A of the first pattern of holes 985A such that a first confinement layer form 1111A has been formed. The first confinement layer form 1111A defines a first aperture 913A configured to at least partially provide lateral electrical and/or optical confinement during operation of the VCSEL 900. The first confinement layer form 1111A further comprises a continuous and/or contiguous oxidized portion 1184A that includes the portion of the first confinement layer form 1111A comprising an oxidized material (e.g., oxidized InAlGaAs and/or InAlAs, in an example embodiment). The first confinement layer form 1111A comprises non-oxidized portions 1186 (e.g., comprising InAlGaAs and/or InAlAs, in an example embodiment) that include the one or more first apertures 913A and possibly a peripheral portion of the first confinement layer form 1111A.

Continuing with FIG. 10, at step/operation 1108, a portion of the second reflector 904 (e.g., first GaAs layer 942A, first AlGaAs layer 944A, and second GaAs layer 942B) are formed on the first surface of the first exposed layer 1180A (e.g., the first patterned layer 988A). In an example embodiment, the first GaAs layer 942A, first AlGaAs layer 944A, and the second GaAs layer 942B are formed on a reflector substrate, bonded and/or fused onto the first patterned layer 985A, and then the reflector substrate is removed (e.g., via an etching process). In an example embodiment, the first GaAs layer 942A is bonded and/or fused to the first patterned layer 985A such that the resulting fused interface is a low resistivity interface (e.g., e.g., less than $1*10^{-3}$ ohms*cm$^2$). For example, as shown in FIG. 11D, one or more layers of the second reflector are fabricated on, formed, and/or bonded onto the second current spreading layer 908 and/or the first patterned layer 988A. In an example embodiment, the first AlGaAs layer 544A is the second to-be-oxidized layer 1182B and comprises AlGaAs. In various embodiments, the second GaAs layer 942B of the second reflector is the second exposed layer 1180B.

For example, a first GaAs layer 542A of the second reflector 504 is formed and/or bonded such that a second surface of the first GaAs layer 542A is formed on and/or bonded/fused to a first surface of the second current spreading layer 908 (e.g., the first patterned layer 988A). The second surface of the second GaAs layer 942B is exposed to the surrounding environment, such that the second GaAs layer 942B is the second exposed layer 1180B. The first AlGaAs layer 944A is the second to-be-oxidized layer 1182B.

Figure 11E:
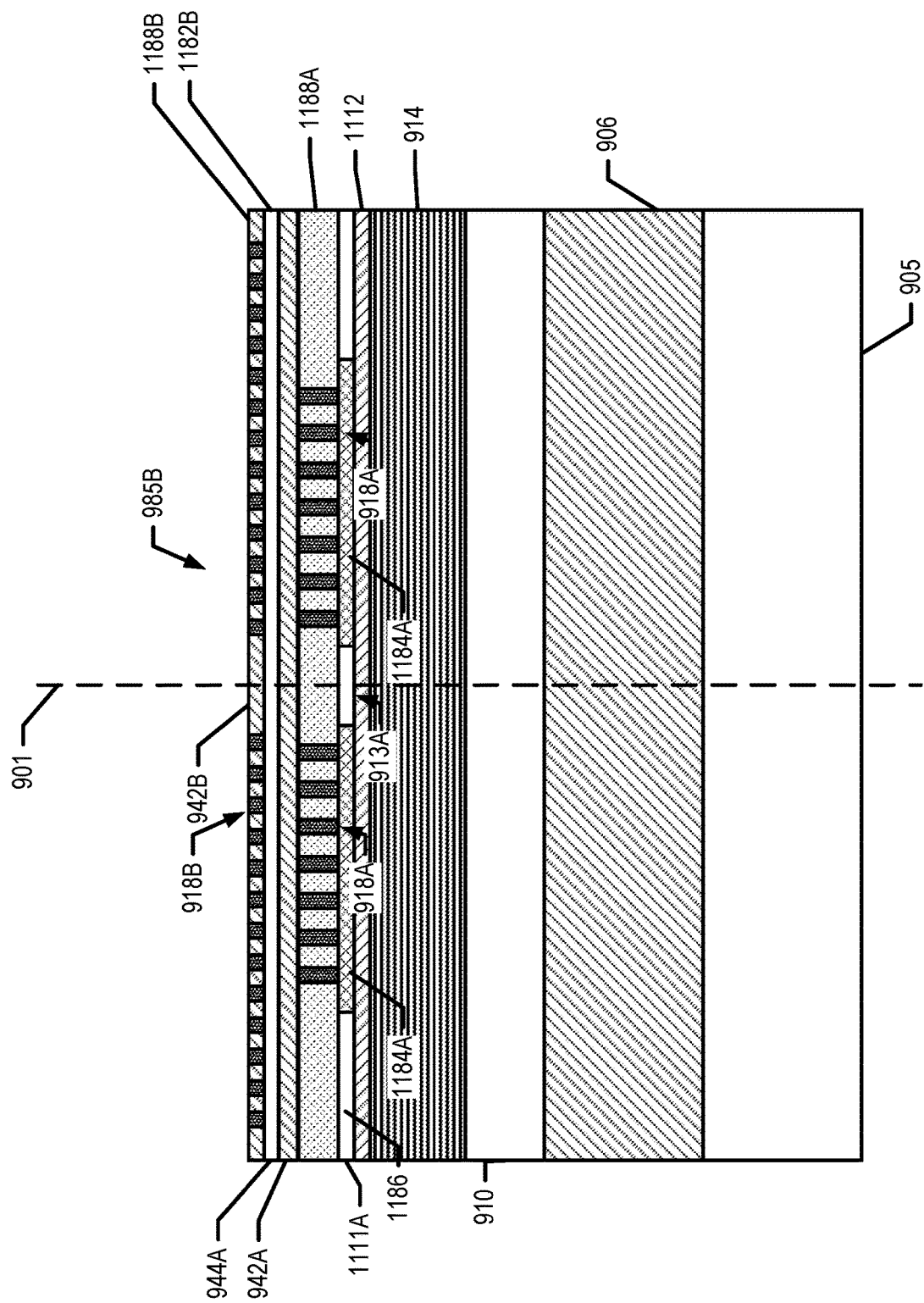

Continuing with FIG. 10, at step/operation 1010, a second pattern of holes 985B is etched through the second exposed layer 1180B to form a second patterned layer form 1188B, as shown in FIG. 11E. For example, a masking process (e.g., photographic masking) is used to define and etch the second pattern of holes 985B, in an example embodiment. In various embodiments, each hole 918B of the second pattern of holes 985B is etched from a first surface of the second exposed layer 1180B through to at least a second surface of the second exposed layer. In an example embodiment, one or more holes 918B of the second pattern of holes 985B may be etched part way through the second to-be-oxidized layer 1182B. FIG. 11E illustrates the results of etching the second pattern of holes 985B through the second exposed layer 1180B to form a second patterned layer form 1188B. In various embodiments, the holes 918B are etched through the second exposed layer 1180B in a direction that is transverse and/or substantially perpendicular to a level plane defined by a surface of the substrate 905. In various embodiments, the level plane is generally and/or substantially parallel to the first surface of the second to-be-oxidized layer 1182B.

As described above, the second pattern of holes 985B etched through the second exposed layer 1180B is generated, selected, and/or the like to define the location, size, and shape of the one or more second apertures 913B of the VCSEL 900. Additionally, the second pattern of holes 985B etched through the second exposed layer 1180B is generated, selected, and/or the like to enable complete oxidation of the oxidized portion of the second confinement layer form 1111B formed by oxidizing the second to-be-oxidized layer 1182B. The oxidized portion consists of the parts of the second confinement layer form 1111B that are not part of the one or more second apertures 913B, possibly with the exclusion of a portion of the periphery of the second confinement layer form 1111B, similar to as shown in FIGS. 2A and 2B. Thus, in various embodiments, the nearest neighbor spacing s of the holes 918B are configured such that all of the second to-be-oxidized layer 1182B between the holes 918B and that is not intended to be part of a second aperture 913B can be fully oxidized given the mobility of oxygen in the material of the second to-be-oxidized layer 1182B. In various embodiments, the nearest neighbor spacing s is no more than 10 microns (e.g., s≤10 μm).

Continuing with FIG. 10, at step/operation 1012, the second confinement layer form 1111B is formed by oxidizing the second to-be-oxidized layer 1182B through the holes 918B of the second pattern of holes 985B. For example, the substrate 905 (e.g., wafer, etc.) on which the semiconductor is being fabricated may be placed in an oxidation chamber and exposed to an oxidizing gas. In an example embodiment, the oxidizing gas comprises water vapor. In various embodiments, the semiconductor being formed on the substrate 905 (and the layers formed thereon) is exposed to the oxidizing gas at a temperature in the range of 400-500° C. for a defined period of time. In an example embodiment, the defined period of time is in a range of fifteen minutes to three hours. In an example embodiment, the defined period of time is in a range of five to thirty minutes.

Figure 11F:
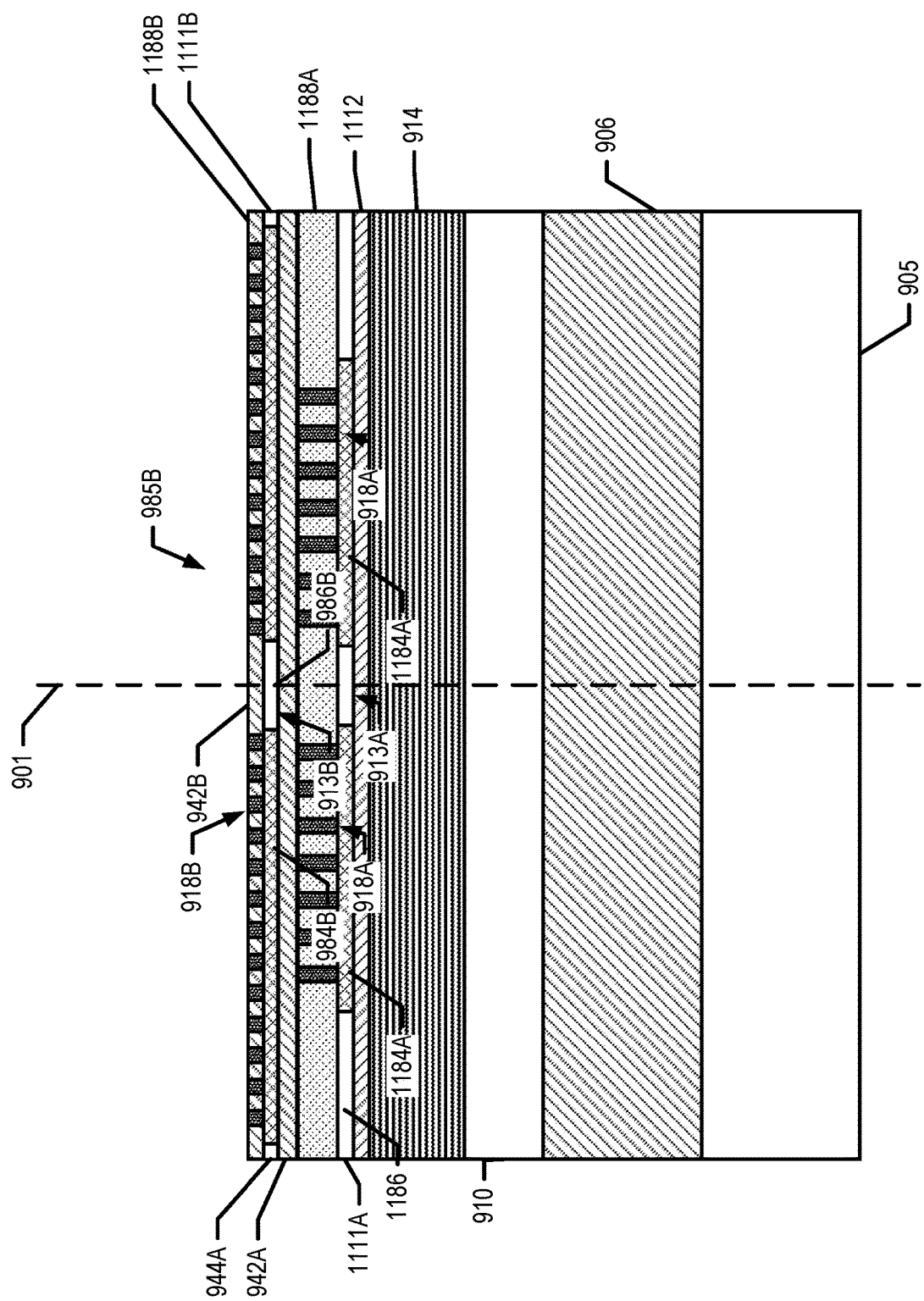

FIG. 11F shows the result of step/operation 1012 in the fabricating of a VCSEL 900. In particular, the second to-be-oxidized layer 1182B has been oxidized through the holes 918B of the second pattern of holes 985B such that a second confinement layer form 1111B has been formed. The second confinement layer form 1111B defines at least one second aperture 913B configured to provide lateral electrical and/or optical confinement during operation of the VCSEL 900. The second confinement layer form 1111B further comprises a contiguous oxidized portion 984B that includes the portion of the second confinement layer form 1111B comprising an oxidized material (e.g., oxidized AlGaAs, in an example embodiment). The second confinement layer form 1111B comprises non-oxidized portions 986 (e.g., comprising AlGaAs, in an example embodiment) that include the one or more second apertures 913B and possibly a peripheral portion of the second confinement layer form 1111B.

Returning to FIG. 10, at step/operation 1014, additional processing is performed to complete the fabrication of the semiconductor. For example, one or more additional processing steps are performed to finish fabricating the VCSEL 900 illustrated in FIG. 9 from the fabrication stage shown in FIG. 11F. For example, one or more additional layers (e.g., AlGaAs layers 944 and/or GaAs layers 942) of the second reflector 904 are formed and/or fabricated on the second patterned layer form 1188B (or the second patterned layer 988B) to complete the formation of the second reflector 904. For example, an etching process may be performed to generate the mesa structure of the VCSEL 900. For example, the etching process may be configured to form the first reflector 906 from the first reflector form 1106, the first current spreading layer 910 from the first current spreading layer form 1110, the active region 914 from the active region form 1114, the tunnel junction 912 from the tunnel junction form 1112, the first oxide confinement layer 911A from the first confinement layer form 1111A, the second current spreading layer 908 from the second current spreading layer form 1108, the second confinement layer 911B from the second confinement layer form 1111B, and the second patterned layer 988B from the second patterned layer form 1188B. The contacts 920A, 920B are deposited and/or patterned onto the etched mesa of the active material structure 907 (e.g., onto the first current spreading layers 910 and the second patterned layer 988B, respectively, and/or the like). As should be understood, the additional processing steps required to complete the semiconductor device after the formation of the second confinement layer depend on the particular semiconductor device and the position of the second confinement layer within the semiconductor device.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for forming an at least partially oxidized confinement layer of a semiconductor device, the method comprising:
    forming a to-be-oxidized layer of a semiconductor device on a substrate, wherein the to-be-oxidized layer has a first surface and a second surface opposite the first surface;
    forming an exposed layer having a first surface and a second surface opposite the first surface such that the second surface of the exposed layer is immediately adjacent to the first surface of the to-be-oxidized layer, and such that the to-be-oxidized layer is disposed between the substrate and the exposed layer;
    etching the exposed layer, using a masking process on the exposed layer and before forming another semiconductor layer of the semiconductor device immediately adjacent to the first surface of the exposed layer, to form a pattern of holes that extend through the exposed layer at least to the first surface of the to-be-oxidized layer and not through the second surface of the to-be-oxidized layer, the first surface of the to-be-oxidized layer being a surface of the to-be-oxidized layer that is parallel to a level plane defined by a surface of the substrate that is closest to the exposed layer, each hole of the pattern of holes extending in a direction that is transverse to the level plane; and
    oxidizing, before forming the other semiconductor layer of the semiconductor device immediately adjacent to the first surface of the exposed layer, the to-be-oxidized layer through the pattern of holes by exposing the to-be-oxidized layer and the exposed layer of the semiconductor device to an oxidizing gas to form a confinement layer.

2. The method of claim 1, further comprising forming at least one active layer comprising an InP-based material.

3. The method of claim 2, wherein the to-be-oxidized layer comprises InAlGaAs or InAlAs and the confinement layer comprises oxidized InAlGaAs or oxidized InAlAs.

4. The method of claim 1, wherein:
    the semiconductor device is a vertical-cavity surface-emitting laser (VCSEL), and
    the method further comprises:
        forming a first reflector and an active region, the first reflector being disposed between the substrate and the active region, and
        forming a second reflector, the active region being disposed between the first reflector and the second reflector.

5. The method of claim 4, wherein:
    the to-be-oxidized layer is a spacer layer disposed between the active region and the second reflector; or
    forming the second reflector comprises forming the to-be-oxidized layer as a layer of the second reflector.

6. The method of claim 4, wherein the VCSEL is configured to emit light of a characteristic wavelength in a range of 1200-2000 nm.

7. The method of claim 4, further comprising, after forming the confinement layer, forming or bonding the second reflector onto the exposed layer.

8. The method of claim 7, wherein, after the forming or bonding of the second reflector on to the exposed layer, the exposed layer still comprises the pattern of holes.

9. The method of claim 4, wherein the confinement layer comprises at least one aperture portion, the aperture portion being an unoxidized portion of the confinement layer that defines an electro-optical aperture of the VCSEL.

10. The method of claim 9, wherein a shape of the aperture portion defines an optical beam profile and polarization of light emitted by the VCSEL.

11. The method of claim 9, wherein the at least one aperture portion comprises two or more aperture portions, wherein the VCSEL is configured to emit light through two or more optical apertures, each of the two or more optical apertures defined by a respective one of the two or more aperture portions.

12. The method of claim 9, wherein the at least one aperture portion is defined by the pattern of holes.

13. The method of claim 4, wherein the pattern of holes defines a shape and a pattern of at least one electro-optical aperture of a single- and/or multi-mode VCSEL configuration.

14. The method of claim 1, wherein each hole of the pattern of holes has at least one closest neighbor that is located no more than ten microns from the hole.

15. The method of claim 1, wherein each hole of the pattern of holes has a diameter in a range of 0.5 to 5 microns.

16. A method for forming an at least partially oxidized confinement layer of a semiconductor device, the method comprising:
    forming a to-be-oxidized layer of a semiconductor device on a substrate, wherein the to-be-oxidized layer has a first surface and a second surface opposite the first surface;
    forming an exposed layer of the semiconductor device having a first surface and a second surface opposite the first surface such that the second surface of the exposed layer is immediately adjacent to the first surface of the to-be-oxidized layer opposite the substrate, wherein the first surface of the to-be-oxidized layer is parallel to a plane defined by a surface of the substrate that is closest to the exposed layer;
    after forming the exposed layer and before forming another semiconductor layer of the semiconductor device immediately adjacent to the first surface of the exposed layer, etching the exposed layer, using a masking process, to form a pattern of holes that extend through the exposed layer at least to the first surface of the to-be-oxidized layer and not through the second surface of the to-be-oxidized layer, wherein each hole of the pattern of holes extends in a direction that is transverse to the plane defined by the surface of the substrate; and after etching the pattern of holes and before forming the other semiconductor layer of the semiconductor device immediately adjacent to the first surface of the exposed layer, oxidizing the to-be-oxidized layer through the pattern of holes with an oxidizing gas to form a confinement layer.

17. The method of claim 16, comprising forming at least one active layer comprising an InP-based material.

18. The method of claim 17, wherein the to-be-oxidized layer comprises InAlGaAs or InAlAs and the confinement layer comprises oxidized InAlGaAs or oxidized InAlAs.

19. The method of claim 16, comprising:
    forming a first reflector;
    forming an active region, wherein the first reflector is disposed between the substrate and the active region; and
    forming a second reflector, wherein active region is disposed between the first reflector and the second reflector.

20. The method of claim 19, wherein the to-be-oxidized layer is one of (a) a spacer layer disposed between the active region and the second reflector or (b) a layer of the second reflector.

\* \* \* \* \*